(12) United States Patent
Choi

(10) Patent No.: US 12,243,574 B2
(45) Date of Patent: Mar. 4, 2025

(54) CONTENT ADDRESSABLE MEMORY DEVICE AND OPERATING METHOD THEREOF

(71) Applicants: SEOUL NATIONAL UNIVERSITY R&DB FOUNDATION, Seoul (KR); Sogang University Research & Business Development Foundation, Seoul (KR)

(72) Inventor: Woo Young Choi, Seoul (KR)

(73) Assignees: SEOUL NATIONAL UNIVERSITY R&DB FOUNDATION, Seoul (KR); SOGANG UNIVERSITY RESEARCH & BUSINESS DEVELOPMENT FOUNDATION, Seoul (KR)

( * ) Notice: Subject to any disclaimer, the term of this patent is extended or adjusted under 35 U.S.C. 154(b) by 128 days.

(21) Appl. No.: 17/893,646

(22) Filed: Aug. 23, 2022

(65) Prior Publication Data

US 2023/0063076 A1    Mar. 2, 2023

(30) Foreign Application Priority Data

Aug. 24, 2021   (KR) .................. 10-2021-0111470
Aug. 19, 2022   (KR) .................. 10-2022-0104120

(51) Int. Cl.
  *G11C 15/04*   (2006.01)
  *G11C 11/22*   (2006.01)
  *G11C 11/56*   (2006.01)

(52) U.S. Cl.
  CPC ...... *G11C 11/2253* (2013.01); *G11C 11/5657* (2013.01); *G11C 15/04* (2013.01)

(58) Field of Classification Search
  CPC ... G11C 11/22; G11C 11/223; G11C 11/2259; G11C 11/40; G11C 15/00; G11C 15/02; G11C 15/04; G11C 15/043; G11C 15/046
  See application file for complete search history.

(56) References Cited

U.S. PATENT DOCUMENTS

| 9,082,481 B2 | 7/2015 | Terzioglu et al. |
| 2010/0140589 A1 | 6/2010 | Ionescu |

(Continued)

FOREIGN PATENT DOCUMENTS

| KR | 10-2001-0107136 A | 12/2001 |
| KR | 10-2015-0093245 A | 8/2015 |

OTHER PUBLICATIONS

K. Ni et al., "Ferroelectric ternary content-addressable memory for one-shot learning," Nature Electronics, vol. 2, pp. 521-529, 2019. https://doi.org/10.1038/s41928-019-0321-3.

(Continued)

*Primary Examiner* — Alfredo Bermudez Lozada
(74) *Attorney, Agent, or Firm* — Harness, Dickey & Pierce, P.L.C.

(57) ABSTRACT

A content addressable memory device including a memory cell array including a plurality of memory cells, each of which has a ferroelectric tunnel field effect transistor (FeTFET), and a match amplifier connected to the plurality of memory cells through a plurality of match lines may be provided. The FeTFET includes a first doped region including a first conductivity type, a second doped region including a second conductivity type different from the first conductivity type, a channel region formed between the first doped region and the second doped region, and a gate formed on the channel region and including a ferroelectric layer.

18 Claims, 18 Drawing Sheets

(56) References Cited

U.S. PATENT DOCUMENTS

2012/0286340 A1 11/2012 Frank et al.
2015/0214323 A1 7/2015 Dubourdieu et al.
2017/0249993 A1* 8/2017 Pelley .................... G11C 29/72
2020/0312971 A1 10/2020 Penumatcha et al.
2021/0050060 A1 2/2021 Li et al.
2021/0233587 A1 7/2021 Lu
2022/0148636 A1* 5/2022 Lu ....................... G11C 11/2255

OTHER PUBLICATIONS

X. Yin et al., "FeCAM: A Universal Compact Digital and Analog Content Addressable Memory Using Ferroelectric," IEEE Transactions on Electron Devices, vol. 67, No. 7, pp. 2785-2792, Jul. 2020, doi: 10.1109/TED.2020.2994896.
Kostas Pagiamtzis et al., Content-Addressable Memory (CAM) Circuits and Architectures: A Tutorial and Survey, IEEE, 2006.
Bayram, Ismail and Yiran Chen. "NV-TCAM: Alternative designs with NVM devices." *Integration, the VLSI Journal* , vol. 62 (2018): pp. 114-122.

* cited by examiner

|        | C11           | C12           | C13           | C14           |
|--------|---------------|---------------|---------------|---------------|
| CASE 1 | match         | match         | match         | match         |
| CASE 2 | miss match    | match         | match         | match         |
| CASE 3 | miss match    | miss match    | miss match    | miss match    |

CONTENT ADDRESSABLE MEMORY DEVICE AND OPERATING METHOD THEREOF

CROSS-REFERENCE TO RELATED APPLICATIONS

This application claims priority under 35 U.S.C. § 119 to Korean Patent Application No. 10-2021-0111470 filed on Aug. 24, 2021 and No. 10-2022-0104120 filed on Aug. 19, 2022, in the Korean Intellectual Property Office, the disclosures of which are incorporated by reference herein in their entireties.

BACKGROUND

Embodiments of the present disclosure described herein relate to a content addressable memory (CAM) device and an operating method thereof, and more particularly, relate to a CAM including a CAM memory cell based on a ferroelectric tunnel field effect transistor (FeTFET) device and an operating method thereof.

A conventional random access memory (RAM) such as SRAM, DRAM, or the like stores data during a write period and reads the stored memory during a read period. In this case, the RAM needs to set a location of a specific memory referred to as an "address", and thus a sequential memory operation is impossible.

The sequential memory operation of the RAM is not suitable for a high-speed search for massive data, which has recently become a hot topic in big data and artificial intelligence fields. Research for increasing the bandwidth is actively in progress to overcome the issues, but a fundamental solution is still some way off.

On the other hand, a CAM simultaneously compares all data stored in memory with data to be found, in parallel without performing address-based sequential memory operations. Accordingly, as the data capacity increases and the demand for high-speed operation increases, the CAM is expected to be used increasingly. However, although the technical demand for CAM is significantly increasing, it is difficult to implement a high capacity of memory. In addition, the CAM has high power consumption, and thus is not actively used for various purposes.

About 10 MOSFETs are used in a binary CAM (BCAM), and about 16 MOSFETs are used in a ternary CAM (TCAM). This makes the implementation of high-capacity CAM difficult. As the capacity of data increases, the power consumption and operating time required for a memory operation increase. Accordingly, the CAM is inevitably implemented with a much smaller capacity than the RAM.

Korean Patent Publication No. 10-2015-0093245 relates to a static NAND cell for a TCAM, and more particularly, relate to a static TCAM includes a key cell coupled to a first pull-down transistor and a first pull-up transistor, a mask cell coupled to a second pull-down transistor and a second pull-up transistor, and a match line output that is connected to the first pull-down transistor and the second pull-down transistor in parallel, connected to the first pull-up transistor and the second pull-up transistor in series, coupled to the first pull-down transistor and the second pull-down transistor, and additionally coupled to the first pull-up transistor and the second pull-up transistor.

Besides, Korean Patent Publication No. 2001-0107136 relates to a CAM cell including a latch means for respectively latching first data and second data, which are complementary, at a first node and a second node, a first transistor having a current path formed between a first bit line and the first node and a gate connected to a word line, a second transistor having a current path formed between a second bit line and the second node and a gate connected to the word line, a third transistor having a current path formed between the first bit line and a third node and a gate connected to the second node, a fourth transistor having a current path formed between the third node and the second bit line and a gate connected to the first node, a fifth transistor having a current path formed between a match line and a ground voltage and a gate connected to the third node, and a precharge transistor having a current path formed between a supply voltage and the match line and a gate connected to a precharge signal, and each of the third and fourth transistors composed of an PMOS transistor.

There is a prior art disclosed as Korean Patent Publication No. 10-2015-0093245 (2015 Aug. 17) (Patent Document 0001).

There is a prior art disclosed as Korean Patent Publication No. 10-2001-0107136 (2001 Dec. 7) (Patent Document 0002).

SUMMARY

Embodiments of the present disclosure provide a CAM that may perform multi-bit CAM operation by using a single transistor and may implement a degree of mismatch at the same time, by implementing a multi-bit CAM based on a FeTFET, and an operating method thereof.

According to an embodiment, a content addressable memory (CAM) device includes a memory cell array including a plurality of memory cells, each of which has a ferroelectric tunnel field effect transistor (FeTFET), and a match amplifier connected to the plurality of memory cells through a plurality of match lines. The FeTFET includes a first doped region including a first conductivity type, a second doped region including a second conductivity type different from the first conductivity type, a channel region formed between the first doped region and the second doped region, and a gate formed on the channel region and including a ferroelectric layer.

According to an embodiment, an operating method of a CAM device including a memory cell array including a plurality of memory cells, each of which has a FeTFET, and a match amplifier connected to the plurality of memory cells through a match line includes precharging the match line by applying a ground voltage to the match line, inputting a codeword into a memory cell connected to the match line, determining whether data is matched or mismatched, by comparing the data stored in the memory cell connected to the match line with the codeword, not discharging the match line when it is determined that the codeword matches the stored data, discharging the match line when it is determined that the codeword does not matches the stored data, and generating, by the match amplifier, an output signal based on a discharge rate of the match line.

According to an embodiment, an operating method of a CAM device including a memory cell array including a plurality of memory cells, each of which has a FeTFET, a match amplifier connected to the plurality of memory cells through a match line, and a current source supplying a current to the match line includes precharging the match line by applying a power supply voltage to the match line, inputting a codeword into a memory cell connected to the match line, determining whether data is matched or mismatched, by comparing the data stored in the memory cell connected to the match line with the codeword, charging the match line when it is determined that the codeword matches the stored data, not charging the match line when it is determined that the codeword does not match the stored data, and generating, by the match amplifier, an output signal.

Among embodiments, according to an embodiment of the present disclosure, the CAM device includes a plurality of CAM memory cells connected in parallel based on a match line and a sense amplifier positioned at one end of the match line and sensing a discharge rate of the match line. One CAM memory cell includes one FeTFET device composed of P+ region and N+ region, which are formed on a semiconductor substrate so as to be spaced from the semiconductor substrate as much as a specific distance, a channel region formed between the P+ region and the N+ region, and a gate formed on the channel region.

The CAM device further includes a search line SL for inputting search data, and the search line is connected to the gate of the CAM memory cell.

The CAM device further includes a precharge unit connected to the match line so as to precharge the match line to a power supply voltage VDD (or a high voltage).

The CAM device further includes a current source that precharges a match line ML to a low voltage GND and then supplies a charging current IML to the match line.

The gate includes an insulating layer, a ferroelectric layer, and a gate electrode layer. The ferroelectric layer includes one of $PZT(Pb(Zr,Ti)O_3)$, $SBT(SrBi_2Ta_2O_9)$, $SBTN(SrBi_2(Ta,Nb)O_9)$, $BLT((Bi_x,La1-x)_4Ti_3O_{12})$, $BST(Ba_xSr(1-x)TiO_3)$, hafnium oxide ($HfO_2$), silicon-added hafnium oxide ($HfO_2/Si$), aluminum-added hafnium oxide ($HfO_2/Al$), zirconium-added hafnium oxide ($HfO_2/Zr$), or the combination thereof.

The sense amplifier determines a match/mismatch of data based on a voltage level of a match line according to the discharge or charge during a search operation, and outputs the address whose data is matched.

According to an embodiment, an operating method of a CAM device including a plurality of CAM memory cells connected in parallel based on a match line and including one FeTFET device, and an output terminal of a sense amplifier SA positioned at one end of the match line ML includes precharging the match line by applying a power supply voltage VDD to the match line, inputting search data into the CAM memory cell, determining whether the data is matched or mismatched, by comparing input search data with data stored in the CAM memory cell, maintaining a voltage of the match line when the search data matches the stored data and discharging the match line when the search data does not match the stored data, and generating, by the sense amplifier, an output signal by detecting a discharge rate of the match line.

The inputting of the search data is performed by inputting the search data into one search line connected to the CAM memory cell.

When the search data matches the stored data, the power supply voltage VDD precharged on the match line is maintained, and the voltage at the output terminal of the sense amplifier is maintained.

When the search data mismatches the stored data, the match line is discharged because a discharge current path is generated in the CAM memory cell, and thus a voltage drop occurs at an output terminal of a sense amplifier.

It is determined that the number of mismatched bits increases as the discharge rate of a match line increases and it is determined that the number of mismatched bits increases as a voltage of an amplifier output line rapidly decreases, by determining the number of mismatched bits based on the discharging rate of a match line and a time difference between voltage drops at output terminals of the sense amplifier.

According to an embodiment, an operating method of a CAM device including a plurality of CAM memory cells connected in parallel based on a match line and including one FeTFET device, and a current source for supplying a charging current IML to the match line and an output terminal of a sense amplifier SA positioned at one end of the match line ML includes precharging the match line by applying a ground voltage GND to the match line, inputting search data into the CAM memory cell, determining whether the data is matched or mismatched, by comparing input search data with data stored in the CAM memory cell, maintaining the ground voltage GND of the match line when the search data mismatches the stored data and charging the match line to a high voltage when the search data matches the stored data, and generating, by the sense amplifier, an output signal by detecting a charge rate of the match line.

The inputting of the search data is performed by inputting the search data into one search line connected to the CAM memory cell.

When the search data mismatches the stored data, the match line is discharged because a discharge current path is generated in the CAM memory cell, and thus a current supplied from a current source to the match line is canceled. Accordingly, the ground voltage GND precharged on the match line is maintained, and the voltage at the output terminal of the sense amplifier is maintained.

When the search data matches the stored data, the match line is charged to a high voltage, and a voltage rise occurs at the output terminal of the sense amplifier.

It is determined that the number of mismatched bits increases as the charge rate of a match line decreases and it is determined that the number of mismatched bits increases as a voltage of an amplifier output line slowly increases, by determining the number of mismatched bits based on the charging rate of a match line and a time difference between voltage rises at output terminals of the sense amplifier.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure will be described in detail and clearly to such an extent that an ordinary one in the art easily implements the present disclosure.

Figure 1:
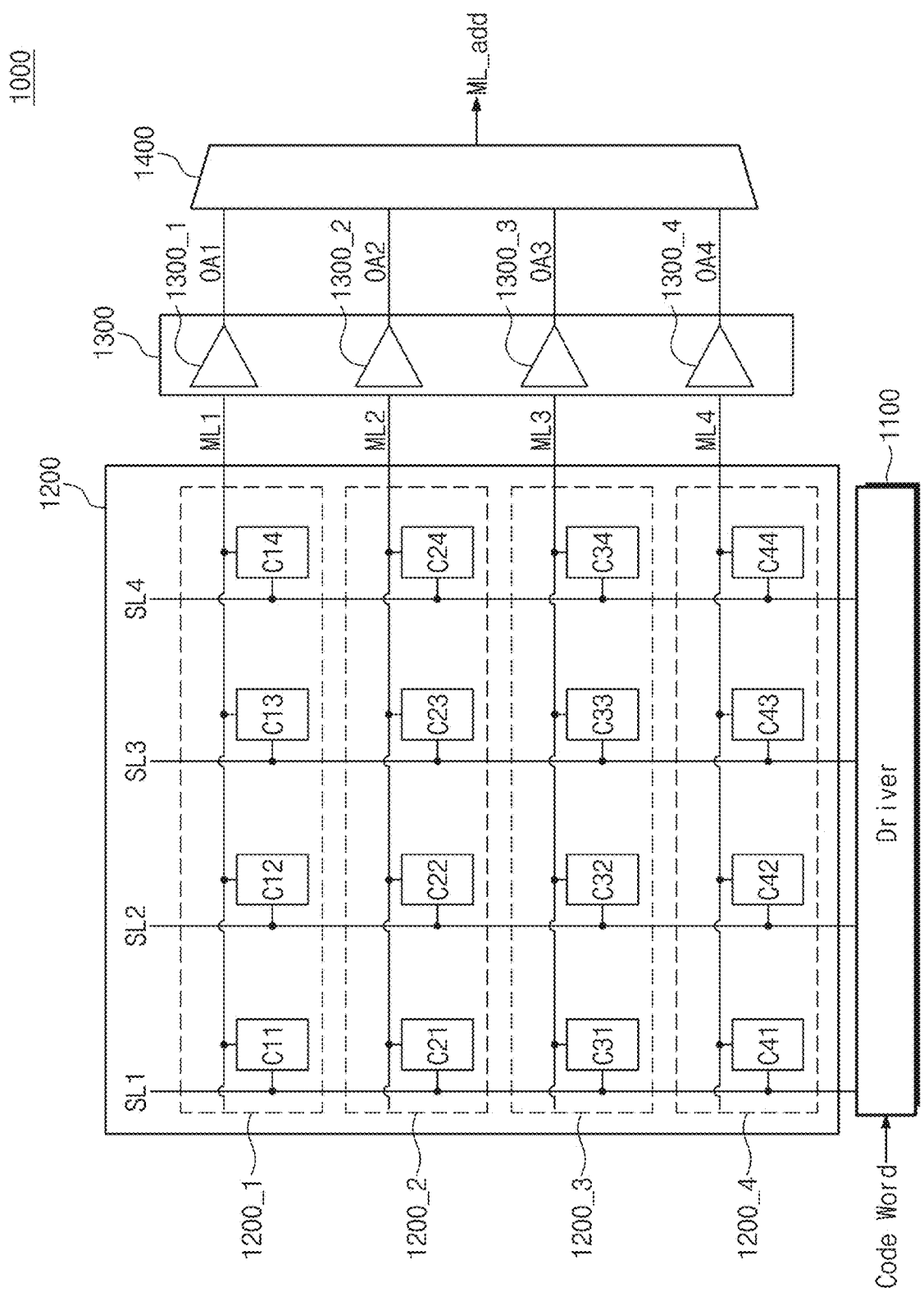
FIG. 1 is a block diagram illustrating a CAM, according to an embodiment of the present disclosure.

FIG. 1 is a block diagram illustrating a CAM, according to an embodiment of the present disclosure. Referring to FIG. 1, a CAM 1000 (hereinafter referred to as a "CAM device") may include a driver 1100, a memory cell array 1200, an amplifier 1300, and a priority encoder 1400. The memory cell array 1200 may include first to fourth memory cell groups 1200_1 to 1200_4. The amplifier 1300 may include first to fourth match amplifiers 1300_1 to 1300_4. In an embodiment, the CAM device 1000 may further include a bias circuit (not shown). In FIG. 1, the number of the first to fourth memory cell groups 1200_1 to 1200_4 and the number of the first to fourth match amplifiers 1300_1 to 1300_4 are only an example, and the present disclosure is not limited thereto.

The driver 1100 provides a codeword (alternatively, search data or input data) to the memory cell array 1200 through first to fourth search lines SL1 to SL4. The codeword refer to data to be found from among data stored in the memory cell array 1200. Hereinafter, the codeword is used as the same meaning as search data and input data. For example, the codeword may be provided from an external processor (not illustrated).

The first memory cell group 1200_1 may include first to fourth memory cells C11 to C14. The second memory cell group 1200_2 may include fifth to eighth memory cells C21 to C24. The third memory cell group 1200_3 may include ninth to twelfth memory cells C31 to C34. The fourth memory cell group 1200_4 may include thirteenth to sixteenth memory cells C41 to C44. Here, the number of memory cells illustrated in FIG. 1 is only one example, and the number of memory cells may be determined depending on sizes of various codewords such as 32 to 256 bits. Also, the number of search lines thus illustrated may be changed depending on the size of a codeword.

Each of the first to sixteenth memory cells C11 to C44 may include a transistor. For example, each of the first to sixteenth memory cells C11 to C44 may include a FeTFET.

In an embodiment, each of the first to sixteenth memory cells C11 to C44 may store 1 bit or 2 bits. However, the scope of the present disclosure is not limited thereto, and the number of bits stored in a memory cell may increase or decrease depending on implementation. For convenience of description, hereinafter, it is assumed that each of the first to sixteenth memory cells C11 to C44 stores 2 bits.

For example, each of the first to sixteenth memory cells C11 to C44 may store logic '11', '10', '01', or '00'. Alternatively, each of the first to sixteenth memory cells C11 to C44 may store logic '11', '10', '01', '00', or "Don't Care" (D.C) bits (i.e., 'XX'). In the case of searching for data (or cell data) stored in memory cells, a memory cell storing a D.C bit may output a matched result regardless of a codeword. That is, the CAM device 1000 may be a TCAM device. Hereinafter, it is assumed that the CAM device 1000 is a TCAM device.

The priority encoder 1400 outputs an address of a memory cell array having data matched with the codeword as a match address ML_add, based on voltages (or signals) provided from amplifier output lines OA1 to OA4. For example, when there are a plurality of memory cell arrays thus matched, the priority encoder 1400 may output an address of one memory cell array depending on a priority algorithm.

For example, it is assumed that a codeword is '11 10 01 00'; the first memory cell C11 stores '11'; the second memory cell C12 stores '10'; the third memory cell C13 stores '01'; the fourth memory cell C14 stores '00'; the fifth memory cell C21 stores '11'; the sixth memory cell C22 stores '10'; the seventh memory cell C23 stores '01'; the eighth memory cell C24 stores '11'; the ninth memory cell C31 stores '00'; the tenth memory cell C32 stores '01'; the eleventh memory cell C33 stores '10'; the twelfth memory cell C34 stores '11'; the thirteenth memory cell C41 stores 'XX'; the fourteenth memory cell C42 stores 'XX'; the fifteenth memory cell C43 stores '01'; and the sixteenth memory cell C44 stores '00'.

Each of the match amplifiers 1300_1 to 1300_4 of the amplifier 1300 may detect a voltage of the corresponding match line and may output, to the priority encoder 1400, the match result (or comparison result) between the codeword and the stored data. For example, when the corresponding match line is matched, each of the match amplifiers 1300_1 to 1300_4 may output a power supply voltage VDD. When the corresponding match line is mismatched, each of the match amplifiers 1300_1 to 1300_4 may output a ground voltage GND. However, the present disclosure is not limited thereto.

In an embodiment, each of the match amplifiers 1300_1 to 1300_4 may determine the number of bits, by which the codeword is mismatched with the stored data, based on a discharge or charge rate of the corresponding match line, and may output information about the number of bits.

In an embodiment, the CAM device 1000 may further include a mismatch ratio output circuit (not shown). The mismatch ratio output circuit may be positioned between the amplifier 1300 and the priority encoder 1400. The mismatch ratio output circuit may determine the number of mismatched bits through the time difference between voltage drops (or voltage rises, they are changed depending on implementation of a match amplifier) of amplifier output lines OA1 to OA4 output from the match amplifiers 1300_1 to 1300_4.

In an embodiment, each of the match amplifiers 1300_1 to 1300_4 may determine that the number of mismatched bits increases as the discharging rate (or charging rate) of the corresponding match line increases. The mismatch ratio output circuit may determine that the number of mismatched bits is increased as a voltage of an amplifier output line rapidly decreases (or increases).

For example, it is assumed that the codeword is "11 10 01 00"; data stored in the first memory cell group 1200_1 is "11 10 01 00"; data stored in the second memory cell group 1200_2 is "11 10 01 11"; data stored in the third memory cell group 1200_3 is "00 01 10 11"; and data stored in the fourth memory cell group 1200_4 is "XX XX 01 00".

The driver 1100 may provide the first search line SL1 with a voltage corresponding to the first code '11' of the codeword. As in the above description, the driver 1100 may provide the second search line SL2 with a voltage corresponding to the second code '10' of the codeword, may provide the third search line SL3 with a voltage corresponding to the third code '01' of the codeword, and may provide the fourth search line SL4 with a voltage corresponding to the fourth code '00' of the codeword.

Each of the first, fifth, ninth, and thirteenth memory cells C11, C21, C31, and C41 may receive the first code '11' of the codeword through the first search line SL1. Each of the second, sixth, tenth, and fourteenth memory cells C12, C22, C32, and C42 may receive the second code '10' of the codeword through the second search line SL2. Each of the third, seventh, eleventh, and fifteenth memory cells C13, C23, C33, and C43 may receive the third code '01' of the codeword through the third search line SL3. Each of the fourth, eighth, twelfth, and sixteenth memory cells C14, C24, C34, and C44 may receive the fourth code '00' of the codeword through the fourth search line SL4.

The first to sixteenth memory cells C11 to C44 may determine whether the stored data matches the provided code. In an embodiment, the match lines ML1, ML2, ML3, and ML4 are precharged with the power supply voltage VDD (or a high voltage) before a recent search operation after a previous data search operation.

The first memory cell group 1200_1 may compare the stored data '11 10 01 00' with the codeword. Because bits of the stored data '11 10 01 00' respectively match bits of the codeword '11 10 01 00', the first memory cell group 1200_1 may not discharge the first match line ML1. Because the data '11 10 01 11' stored in the second memory cell group 1200_2 does not match the codeword '11 10 01 00', the second memory cell group 1200_2 may discharge the second match line ML2 to the ground voltage GND. Because the data '00 01 10 11' stored in the third memory cell group 1200_3 does not match the codeword '11 10 01 00', the third memory cell group 1200_3 may discharge the third match line ML3. Because data 'XX XX 01 00' stored in the fourth memory cell group 1200_4 matches codeword '11 10 01 00', the fourth memory cell group 1200_4 may not discharge the fourth match line ML4.

The first and fourth match amplifiers 1300_1 and 1300_4 receive the power supply voltage VDD (or high voltage), which is not discharged, from the match lines ML1 and ML4, and output the match results to the amplifier output lines OA1 and OA4, respectively. Moreover, the second and third match amplifiers 1300_2 and 1300_3 receive the ground voltage GND, which is discharged, from the match lines ML2 and ML3 and output the match results to the amplifier output lines OA2 and OA3, respectively.

For example, the priority encoder 1400 may set a priority of a memory cell group, in which fewer D.C bits are stored, to be high depending on a priority algorithm. In this case, the priority encoder 1400 may output an address of the first memory cell group 1200_1 having fewer D.C bits among the first and fourth memory cell groups 1200_1 and 1200_4, each of which has matched data, as the match address ML_add. However, the present disclosure is not limited to the above algorithm.

As described above, the memory cell of the CAM device 1000 according to an embodiment of the present disclosure may include a FeTFET, and may determine and output the match result and the number of mismatched bits. Accordingly, the CAM device 1000 thus improved is provided.

Figure 2A:
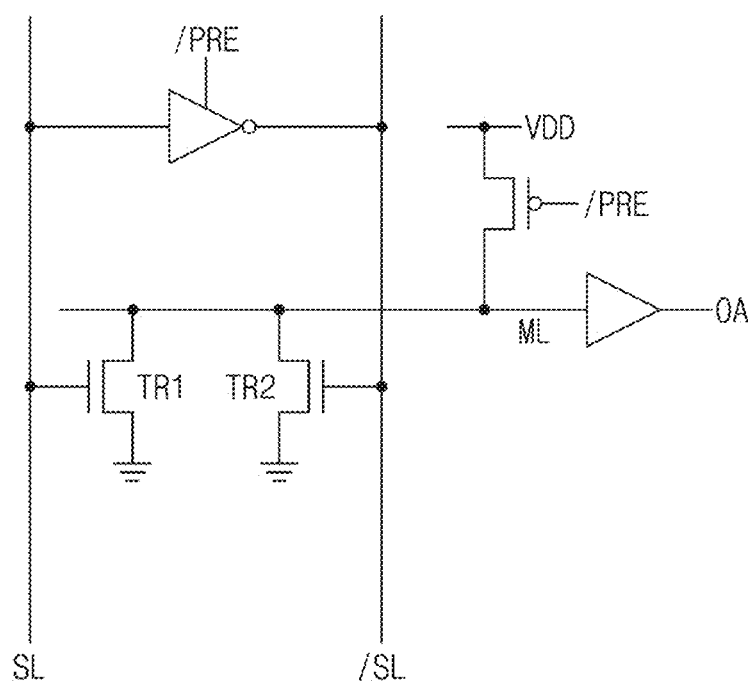
FIG. 2A is a diagram illustrating an example of a MOSFET-based CAM.

FIG. 2A is a diagram illustrating an example of a MOSFET-based CAM. Briefly, a match line ML is provided, and two MOSFET devices TR1 and TR2 connected to the match line ML are arranged in parallel. A search line SL and a complementary search line (or search line bar)/SL are connected to the two MOSFET devices, respectively. Besides, a precharge unit PRE for applying the power supply voltage VDD to the match line and an output terminal OA for outputting a signal sensed from the sense amplifier are further included.

Below, for convenience of description, the terms "sense amplifier," "match amplifier," and the like are interchangeably used. The terms may have the same meaning or different meanings depending on the context of embodiments, and a meaning of each term may be understood depending on the context of embodiments to be described.

Figure 2B:
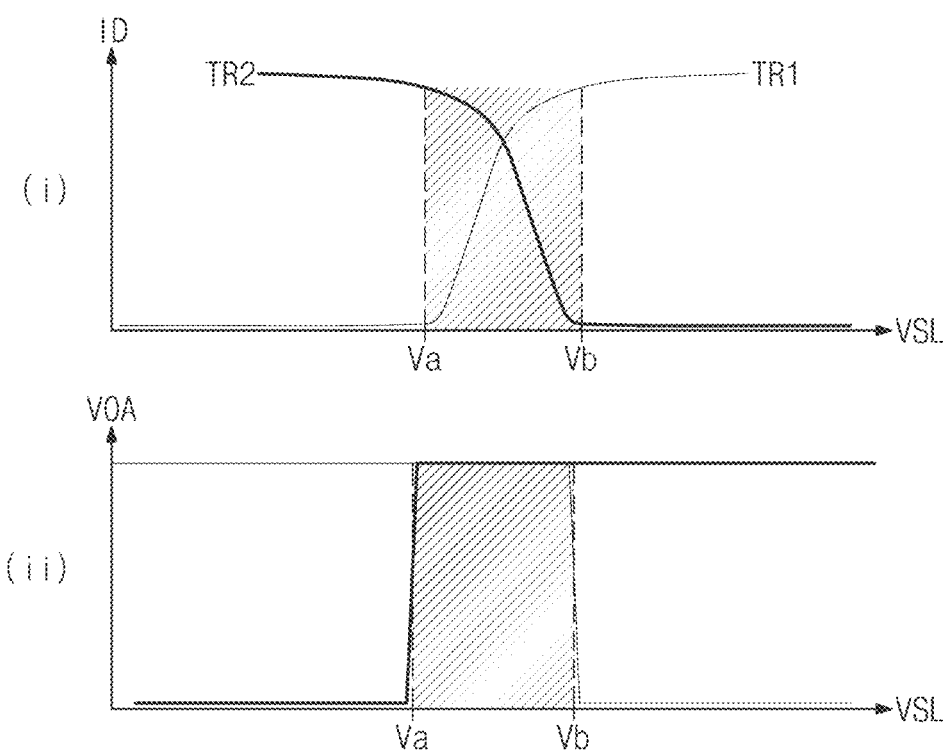
FIG. 2B is a graph for describing features of a MOSFET device of the CAM of FIG. 2A.

FIG. 2B is a graph for describing features of a MOSFET device of the CAM of FIG. 2A. A graph (i) of FIG. 2B shows a drain current ID relative to a gate voltage VSL applied through a search line, and a graph (ii) of FIG. 2B shows a voltage VOA of an output terminal of a sense amplifier relative to the gate voltage VSL applied through the search line.

Referring to FIG. 2B, it may be understood that two transistors have opposite voltages in a section except for a specific voltage section (a section between Va and Vb). As such, to implement a high-pass filter or low-pass filter that allows or blocks a current depending on a gate voltage higher and lower than a threshold voltage, as shown in FIG. 2A, it is essential to combine two MOSFET devices in parallel in the MOSFET device.

Figure 3:
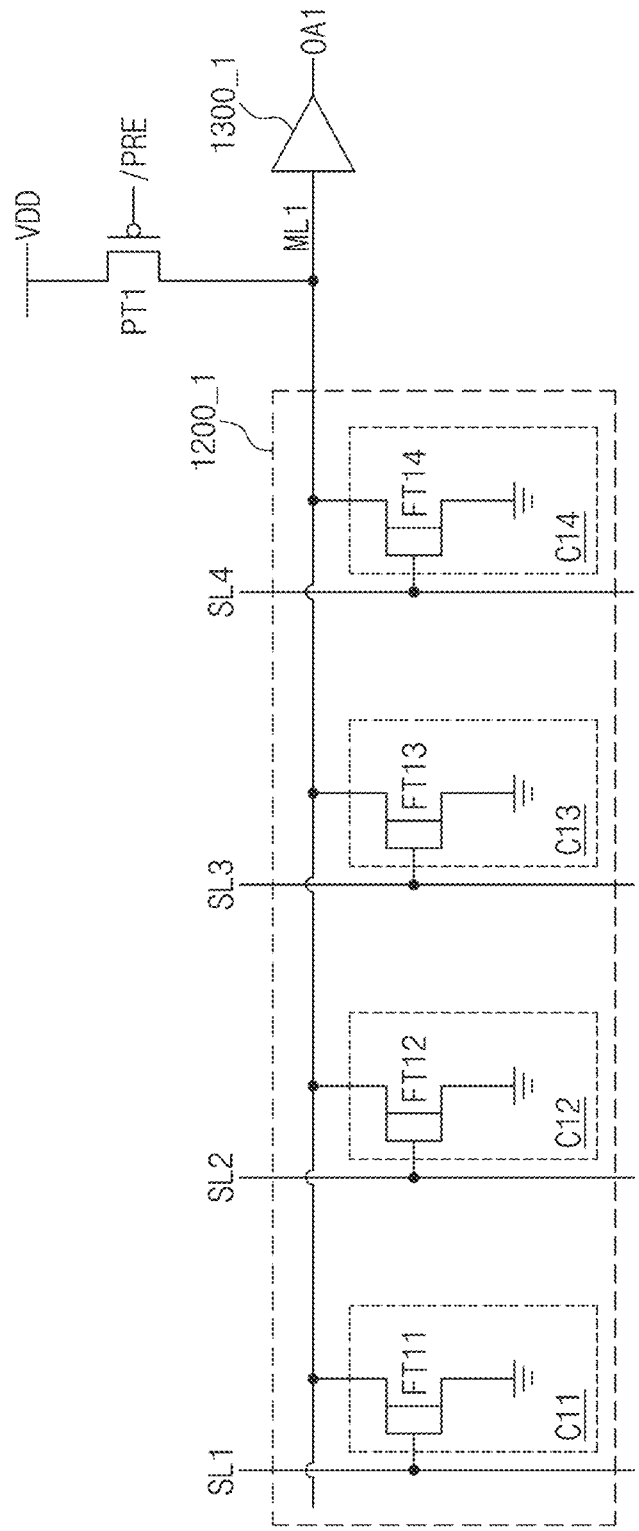
FIG. 3 is a block diagram illustrating an example of a part of the CAM device of FIG. 1.

FIG. 3 is a block diagram illustrating an example of a part of the CAM device of FIG. 1. For brevity of drawing and for convenience of description, only the first memory cell group 1200_1 is shown in FIG. 3. The other memory cell groups 1200_2 to 1200_4 may be the same as or similar to the first memory cell group 1200_1. Referring to FIG. 3, a precharge-high scheme is described.

Referring to FIGS. 1 and 3, each of the first to fourth memory cells C11 to C14 may include a FeTFET. For example, the first memory cell C11 may include a first FeTFET FT11; the second memory cell C12 may include a second FeTFET FT12; the third memory cell C13 may include a third FeTFET FT13; and, the fourth memory cell C14 may include a fourth FeTFET FT14. A gate of the first FeTFET FT11 may be connected to the first search line SL1; a gate of the second FeTFET FT12 may be connected to the second search line SL2; a gate of the third FeTFET FT13 may be connected to the third search line SL3; and, a gate of the fourth FeTFET FT14 may be connected to the fourth search line SL4.

The first FeTFET FT11 may be connected between the first match line ML1 and the ground voltage GND (or a specific voltage, for example, VSS); the second FeTFET FT12 may be connected between the first match line ML1 and the ground voltage GND; the third FeTFET FT13 may be connected between the first match line ML1 and the ground voltage GND; and, the fourth FeTFET FT14 may be connected between the first match line ML1 and the ground voltage GND.

The CAM device 1000 may further include a first precharge transistor PT1. The first precharge transistor PT1 is connected between the power supply voltage VDD and the first match line ML1, and may operate in response to a complementary precharge signal /PRE. The first precharge transistor PT1 may precharge the first match line ML1 to the power supply voltage VDD in response to the complementary precharge signal /PRE. For example, the first precharge transistor PT1 may be a PMOS transistor. The first match amplifier 1300_1 may be connected between the first match line ML1 and the amplifier output line OA1.

In an embodiment, before a recent search operation after a previous data search operation, the first match line ML1 may be precharged to the power supply voltage VDD in response to the complementary precharge signal /PRE. The first to fourth memory cells C11 to C14 are turned on or turned off in response to the corresponding search lines, and thus an operation of generating or blocking a discharge path for the first match line ML1 may be performed.

When the codeword to be found matches (or the same as) data stored in the first memory cell group 1200_1, the first match line ML1 may maintain the precharged voltage. Alternatively, at the time of searching for data of a cell storing data of the D.C bit, the first match line ML1 may maintain the precharged voltage regardless of a codeword. Moreover, when the codeword mismatches (or does not match) the stored data, the first match line ML1 may be discharged.

In an embodiment, the first match amplifier 1300_1 may determine whether the codeword matches or does not match data stored in the first memory cell group 1200_1, based on a voltage level of the first match line ML1. For example, when the first match line ML1 determines that the power supply voltage VDD is maintained, the first match amplifier 1300_1 may determine that the data stored in the first memory cell group 1200_1 matches the codeword. When it is determined that the first match line ML1 is discharged, the first match amplifier 1300_1 may determine that the data stored in the first memory cell group 1200_1 does not match the codeword.

As described above, before the search operation, the first match line ML1 of the first memory cell group 1200_1 may be precharged (or charged) to the power supply voltage VDD (or high voltage), and the first match line ML1 may maintain the precharged voltage or may be discharged depending on match/mismatch between the stored data and search data.

Figure 4:
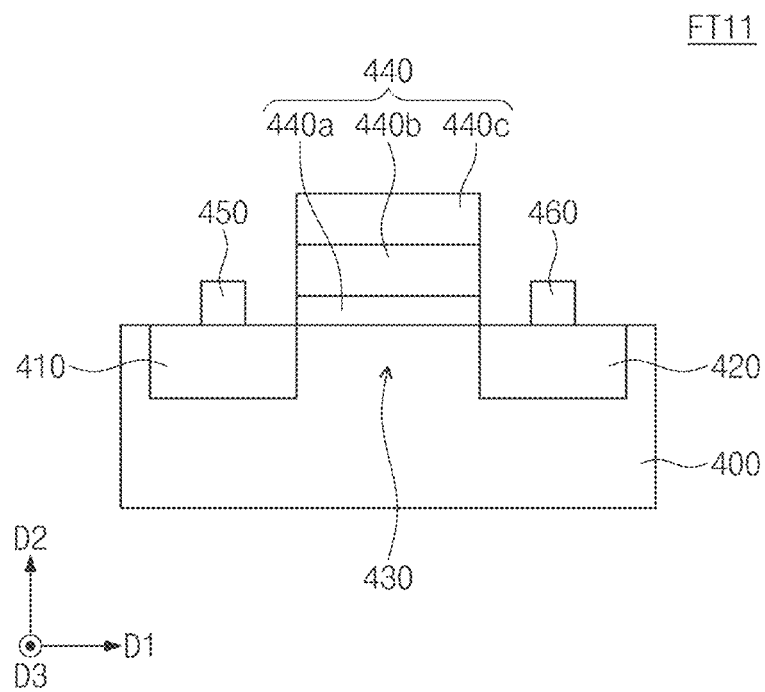
FIG. 4 is a diagram illustrating an example of a first FeTFET device of FIG. 3.

FIG. 4 is a diagram illustrating an example of a first FeTFET device of FIG. 3. The first to fourth FeTFETs FT11 to FT14 are configured to be substantially identical to one another and operate substantially identically to one another. Accordingly, for convenience of description, the first FeT-FET FT11 is described as an example, and each of the remaining cells FT12 to FT14 are the same as or similar to the first FeTFET FT11, and thus a detailed description thereof will be omitted to avoid redundancy.

Referring to FIGS. 3 and 4, the first FeTFET FT11 device may include a first doped region 410 and a second doped region 420, which are formed on a semiconductor substrate 400 so as to be spaced from the semiconductor substrate 400 as much as a predetermined distance and may include a channel region 430 formed between the first doped region 410 and the second doped region 420, and a gate 440 formed on the channel region 430. That is, the first FeTFET FT11 may include the first doped region 410, the second doped region 420, and the channel region 430, which are formed on the semiconductor substrate 400. The first FeTFET FT11 may further include the gate 440, a first electrode 450, and a second electrode 460.

For example, the semiconductor substrate 400 may be a proper semiconductor substrate such as a semiconductor wafer, a silicon-on-insulator substrate, a semiconductor layer formed on the semiconductor substrate, or the like. The semiconductor substrate 400 may be a silicon substrate, but the scope of the present disclosure is not limited thereto. For example, the semiconductor substrate 400 may use other semiconductor materials.

In an embodiment, the semiconductor substrate 400 may be formed as a region (P– region), which is doped with P-type impurities so as to be weaker than the first doped region 410, or an intrinsic region, which is undoped. Alternatively, the semiconductor substrate 400 may be formed as a region (N-region), which is doped with N-type impurities so as to be weaker than the second doped region 420 or an intrinsic region, which is undoped. That is, the semiconductor substrate 400 may be an intrinsic (i-type) silicon substrate.

In an embodiment, the first doped region 410 may have a first conductivity type. For example, the first doped region 410 may have a P+ type. The first doped region 410 may have a first doping concentration. The first doped region 410 may be a source region. The second doped region 420 may have a second conductivity type. For example, the second doped region 420 may have an N+ type. The second doped region 420 may have a second doping concentration. The second doped region 420 may be a drain region.

The first doped region 410 and the second doped region 420 may be spaced in a first direction D1. The first doped region 410 and the second doped region 420 may extend in a direction opposite to a second direction D2 perpendicular to the first direction D1.

In an embodiment, to improve a turn-on operation and a bipolar (or ambipolar) behavior, the doping concentration of the first doped region 410 may be adjusted (or changed), or the doping concentration of the second doped region 420 may be adjusted. The first doped region 410 may have a third doping concentration higher than the first doping concentration. Alternatively, the second doped region 420 may have a fourth doping concentration higher than the second doping concentration.

The channel region 430 may be formed as a region (P– region), which is doped with P-type impurities so as to be weaker than the first doped region 410, or an intrinsic region, which is undoped. Alternatively, the channel region 430 may be formed as a region (N– region), which is doped with N-type impurities so as to be weaker than the second doped region 420, or an intrinsic region, which is undoped.

The gate 440 may be disposed on an upper surface of the channel region 430. The gate 440 may be formed by sequentially stacking a gate insulating layer 440a, a ferroelectric layer 440b, and a gate electrode layer 440c. That is, the gate 440 may include the gate insulating layer 440a, the ferroelectric layer 440b, and the gate electrode layer 440c that are sequentially stacked. The gate 440 may cover a part of an upper surface of the channel region 430.

In this case, the ferroelectric layer 440b may be formed by including one of PZT $(Pb(Zr,Ti)O_3)$, $SBT(SrBi_2Ta_2O_9)$, $SBTN(SrBi_2(Ta,Nb)O_9)$, $BLT((Bi_x,La1-x)_4Ti_3O_{12})$, BST $(Ba_xSr(1-x)TiO_3)$, hafnium oxide $(HfOO_2)$, silicon-added hafnium oxide $(HfO_2/Si)$, aluminum-added hafnium oxide $(HfO_2/Al)$, zirconium-added hafnium oxide $(HfO_2/Zr)$, or the combination thereof.

The first electrode 450 may be disposed on an upper surface of the first doped region 410. In an embodiment, the first electrode 450 may be a source electrode. The second electrode 460 may be disposed on an upper surface of the second doped region 420. In an embodiment, the second electrode 460 may be a drain electrode.

In an embodiment, the first FeTFET FT11 may be a tunnel field-effect transistor (TFET) using a band-to-band tunneling phenomenon. That is, the first FeTFET FT11 may be a FeTFET including a ferroelectric layer. The first FeTFET FT11 has the first doped region 410 and the second doped region 420, which have opposite conductivity types, and a current flow may be controlled by a bias applied to the gate 440.

The first FeTFET FT11 may include a p-type source region (i.e., the first doped region 410), an n-type drain region (i.e., the second doped region 420), and the channel region 430 in an intrinsic state therebetween. Because p-type Fermi level of the source region is different from n-type Fermi level of the drain region while a bias is not applied to a source region, a drain region, and a gate (that is, in a state of thermal equilibrium), energy levels of a valence band and an electron band in the source region may be higher than in the drain region. That is, the energy level of the source region may be higher than the energy level of the channel region, and the energy level of the drain region may be lower than the energy level of the channel region.

Because there is a wide potential barrier between the source region and the drain region when a reverse bias is applied between the source region and the drain region and a turn-off voltage (e.g., 0 V) is applied to the gate (i.e., in a turn-off state where no electric field is applied to the channel region), the tunneling of electric charges does not occur, and the flow of a current that is not less than a threshold current may not occur between the source region and the drain region. However, there may be a slight leakage current flow between the source region and the drain region.

Because a potential barrier between the channel region and the source region is narrowed when a reverse bias is applied between the source region and the drain region, and a gate voltage that is not less than a threshold voltage is applied to the gate electrode (i.e., in a turn-on state where an electric field is applied to the channel region), a band-to-band tunneling phenomenon that electrons are quantum-mechanically tunneled from the valence band of the source region to the conduction band of the channel region may occur. Accordingly, a current flow may occur between the source region and the drain region.

The first FeTFET FT11 may control the flow of electrons or holes through the band-to-band tunneling, and thus a change in an output current may be great in spite of a slight change in a gate voltage (or a driving voltage). That is, the first FeTFET FT11 may have a subthreshold swing at a small threshold voltage or less. Accordingly, the first FeTFET FT11 may be a semiconductor device capable of operating at a low voltage or low power.

In an embodiment, the semiconductor substrate 400, the first doped region 410, the second doped region 420, and the channel region 430 may be formed of a semiconductor material. For example, each of the semiconductor substrate 400, the first doped region 410, the second doped region 420, and the channel region 430 may be formed of at least one of a semiconductor material such as silicon, a semiconductor material (e.g., silicon-germanium (SiGe), germanium (Ge), indium gallium arsenide (InGaAs), or indium arsenide (InAs)) having a narrower bandgap, or a semiconductor material having a direct bandgap.

In an embodiment, all of the semiconductor substrate 400, the first doped region 410, the second doped region 420, and the channel region 430 may be formed of a semiconductor material. For example, all of the semiconductor substrate 400, the first doped region 410, the second doped region 420, and the channel region 430 may be formed of silicon. In an embodiment, the semiconductor substrate 400, the first doped region 410, the second doped region 420, and the channel region 430 may be formed of different materials from one another. For example, the semiconductor substrate 400, the second doped region 420, and the channel region 430 may be formed of silicon, and the first doped region 410 may be formed of silicon-germanium (SiGe). Alternatively, the semiconductor substrate 400, the first doped region 410, and the channel region 430 may be formed of silicon, and the second doped region 420 may be formed of indium arsenide (InAs). Accordingly, the CAM device 1000 may facilitate a band-to-band tunneling of the first FeTFET FT11 device and may reduce a turn-on voltage VTH, thereby improving a turn-on operation and a bipolar (ambipolar) behavior.

Figure 5:
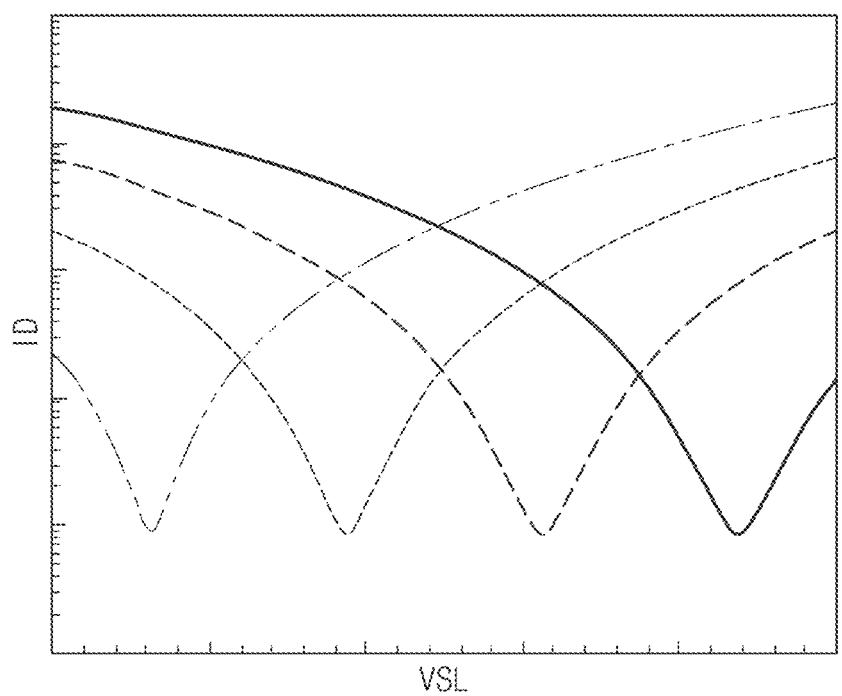
FIG. 5 is a graph illustrating operating features of the first FeTFET device of FIG. 4.

FIG. 5 is a graph illustrating operating features of the first FeTFET device of FIG. 4. Referring to FIG. 5, a horizontal axis indicates the gate voltage VSL applied through a first search line, and a vertical axis indicates the drain current ID.

It may be understood that in the first FeTFET device unlike a MOSFET device, a small current flows at a specific gate voltage, and a high current flows at a gate voltage that is not the specific gate voltage. Through features of the FeTFET device, in the first memory cell C11 of the CAM device according to an embodiment of the present disclosure, a match/mismatch may be determined by using only one transistor. A configuration in which two or more transistors are arranged may be implemented by using only one transistor through this feature, thereby improving the degree of integration of the CAM device by omitting the complementary search line/SL.

Figure 6:
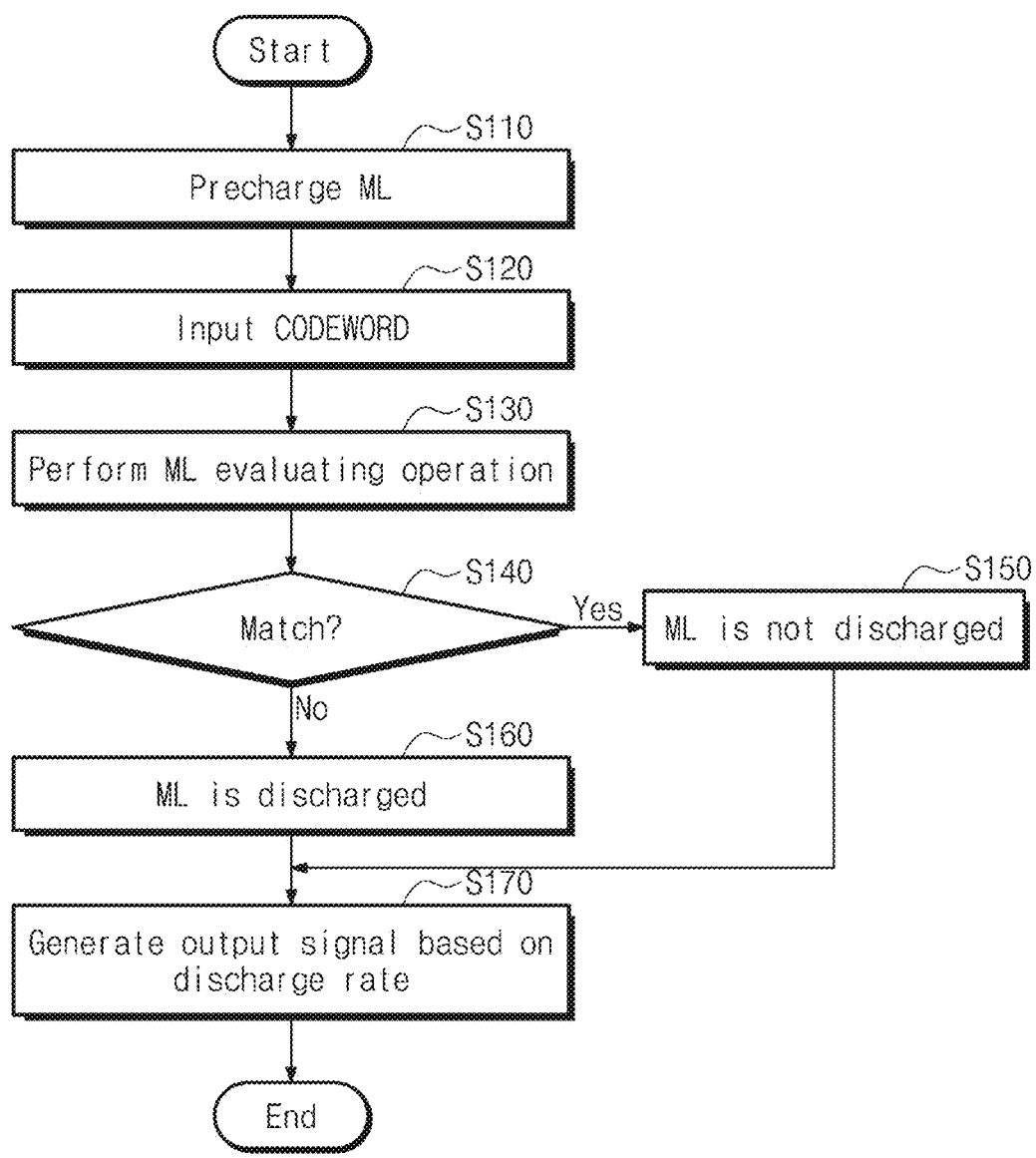
FIG. 6 is a flowchart illustrating an example of an operating method of the CAM device of FIG. 1 including the first memory cell group of FIG. 3.

FIG. 6 is a flowchart illustrating an example of an operating method of the CAM device of FIG. 1 including the first memory cell group of FIG. 3. Referring to FIGS. 1, 3, and 6, in operation S110, the CAM device 1000 may precharge a match line. Hereinafter, for convenience of description, the description is based on the first memory cell group 1200_1. The second to fourth memory cell groups 1200_2 to 1200_4 operate identically or similarly to the first memory cell group 1200_1, and thus a detailed description thereof will be omitted to avoid redundancy. For example, the CAM device 1000 may precharge the first match line ML1 by applying the power supply voltage VDD to the first match line ML1.

In operation S120, the CAM device 1000 may input a codeword. For example, the driver 1100 of the CAM device 1000 may provide (or input) the codeword to the first memory cell group 1200_1 through the plurality of search lines SL1 to SLA. The CAM device 1000 may apply a voltage corresponding to the codeword to the plurality of search lines SL1 to SLA.

In operation S130, the CAM device 1000 may perform a match line evaluation operation. For example, each of the first to fourth memory cells C11 to C14 may determine whether data is matched/mismatched (or match/mismatch), by comparing stored data with the codeword. It is assumed that the first memory cell C11 stores '11' and the second memory cell C12 stores '00' when the codeword is '11 10 01 00'. The first memory cell C11 may store '11', and thus the first FeTFET FT11 of the first memory cell C11 may be turned off in response to a voltage corresponding to '11' provided through the first search line SL1. That is, the first memory cell C11 may be matched. The second memory cell C12 may store '00', and thus the second FeTFET FT12 of the second memory cell C12 may be turned on in response to a voltage corresponding to '10' provided through the second search line SL2. That is, the second memory cell C12 may be mismatched.

In operation S140, the CAM device 1000 may determine the matched/mismatch of a match line. For example, the CAM device 1000 may determine whether the first match line ML1 is matched or mismatched. When the match line is matched, the CAM device 1000 performs operation S150. When the match line is mismatched, the CAM device 1000 performs operation S160.

In operation S150, the match line may not be discharged. For example, when all of the memory cells C11 to C14 of the first memory cell group 1200_1 are matched, the first match line ML1 may not be discharged. That is, the first match line ML1 may maintain a precharged voltage (e.g., the power supply voltage VDD).

In operation S160, the match line may be discharged. For example, when at least one of the memory cells C11 to C14 of the first memory cell group 1200_1 is mismatched, the first match line ML1 may be discharged. That is, the first match line ML1 may be reduced from the precharged voltage to the ground voltage GND.

In operation S170, the CAM device 1000 may generate an output signal based on the discharge rate. For example, when at least one of the memory cells C11 to C14 of the first memory cell group 1200_1 is mismatched, the first match amplifier 1300_1 may determine the degree of mismatch (or the number of mismatched bits) based on the discharge rate of the first match line ML1. The degree of mismatch indicates a ratio of the number of mismatched memory cells to the total number of memory cells in the first memory cell group. The first match amplifier 1300_1 may generate an output signal including the match result and the degree of mismatch through the first amplifier output line OA1 and may transmit the output signal to the priority encoder 1400.

FIGS. 7A to 7D are diagrams for describing an operation of searching for data stored in the first memory cell group of FIG. 3. Referring to FIGS. 3, and 7A to 7D, it is assumed that the first memory cell C11 stores '11'; the second memory cell C12 stores '10'; the third memory cell C13 stores '01'; and the fourth memory cell C14 stores '00'. To search for data, a voltage according to a logic value of a codeword may be applied to the first to fourth search lines SL1 to SLA.

To search for data, the CAM device 1000 may perform a search line precharge step, a match line precharge step, and a match line evaluation step. The CAM device 1000 may precharge a search line in the search line precharge step. Afterward, the CAM device 1000 may precharge the first match line ML1 to the power supply voltage VDD in the match line precharge step. Afterward, the CAM device 1000 may apply a voltage corresponding to the codeword to the plurality of search lines SL1 to SLA in the match line evaluation step. When a mismatch occurs in at least one cell among the plurality of memory cells C11 to C14 of the first memory cell group 1200_1, the first match line ML1 may be discharged to the ground voltage GND. When all the memory cells C11 to C14 of the first memory cell group 1200_1 are matched, the first match line ML1 may maintain a precharged voltage.

As illustrated in a first case CASE 1, all the cells C11 to C14 of the first memory cell group 1200_1 may be matched. For example, the codeword may be '11 10 01 00'. Because the first memory cell C11 stores '11', and a voltage corresponding to '11' is provided through the first search line SL1, the first memory cell C11 may be matched. Because the second memory cell C12 stores '10' and a voltage corresponding to '10' is provided through the second search line SL2, the second memory cell C12 may be matched. Because the third memory cell C13 stores '01' and a voltage corresponding to '01' is provided through the third search line SL3, the third memory cell C13 may be matched. Because the fourth memory cell C14 stores '00' and a voltage corresponding to '00' is provided through the fourth search line SL4, the fourth memory cell C14 may be matched.

Figures 7A, 7B:
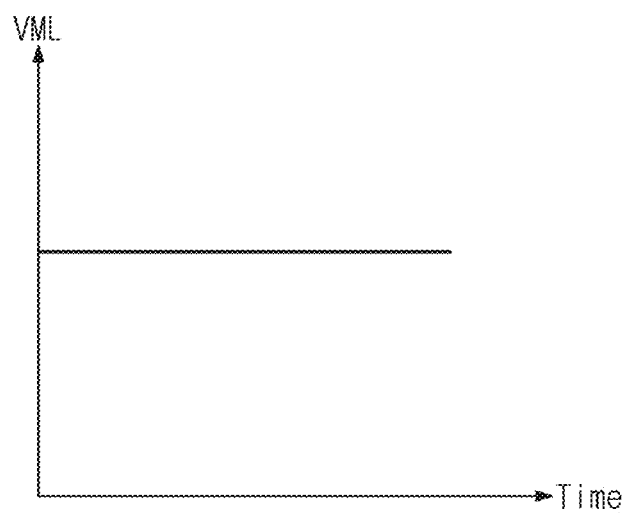
FIGS. 7A to 7D are diagrams for describing an operation of searching for data stored in the first memory cell group of FIG. 3.

FIG. 7B is a graph for describing a voltage of the first match line ML1 over time in the first case CASE 1 of FIG. 7A. A horizontal axis of a graph of FIG. 7B indicates a time, and a vertical axis of a graph of FIG. 7B indicates a voltage VML of the first match line ML1. Referring to FIG. 7B, the voltage VML of the first match line ML1 may maintain a precharged voltage. That is, all the cells C11 to C14 of the first memory cell group 1200_1 are matched, and thus the voltage VML of the first match line ML1 may not be discharged.

As illustrated in a second case CASE 2, the first memory cell C11 may be mismatched, and the second to fourth memory cells C12 to C14 may be matched. For example, the codeword may be '00 10 01 00'. Because the first memory cell C11 stores '11', and a voltage corresponding to '00' is provided through the first search line SL1, the first memory cell C11 may be mismatched. Because the second memory cell C12 stores '10' and a voltage corresponding to '10' is provided through the second search line SL2, the second memory cell C12 may be matched. Because the third memory cell C13 stores '01' and a voltage corresponding to '01' is provided through the third search line SL3, the third memory cell C13 may be matched. Because the fourth memory cell C14 stores '00' and a voltage corresponding to '00' is provided through the fourth search line SL4, the fourth memory cell C14 may be matched.

Figure 7C:
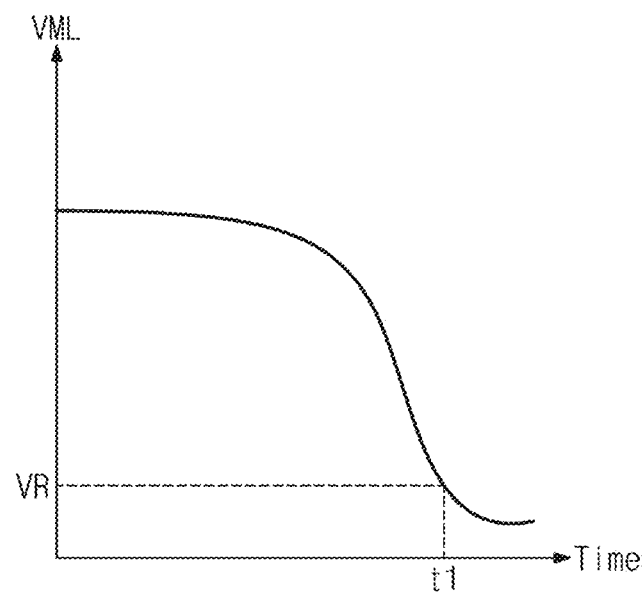

FIG. 7C is a graph for describing a voltage of the first match line ML1 over time in the second case CASE 2 of FIG. 7A. A horizontal axis of a graph of FIG. 7C indicates a time, and a vertical axis of a graph of FIG. 7C indicates the voltage VML of the first match line ML1. Referring to FIG. 7C, the voltage VML of the first match line ML1 may be discharged to the ground voltage GND. Because the first memory cell C11 is mismatched, the voltage VML of the first match line ML1 may be discharged from a precharged voltage to the ground voltage GND. For example, the voltage VML of the first match line ML1 may have a reference voltage VR at a first time point t1.

As illustrated in a third case CASE 3, all the cells C11 to C14 of the first memory cell group 1200_1 may be mismatched. For example, the codeword may be '00 01 10 11'. Because the first memory cell C11 stores '11', and a voltage corresponding to '00' is provided through the first search line SL1, the first memory cell C11 may be mismatched. Because the second memory cell C12 stores '10' and a voltage corresponding to '01' is provided through the second search line SL2, the second memory cell C12 may be mismatched. Because the third memory cell C13 stores '01' and a voltage corresponding to '10' is provided through the third search line SL3, the third memory cell C13 may be mismatched. Because the fourth memory cell C14 stores '00' and a voltage corresponding to '11' is provided through the fourth search line SL4, the fourth memory cell C14 may be mismatched.

Figure 7D:
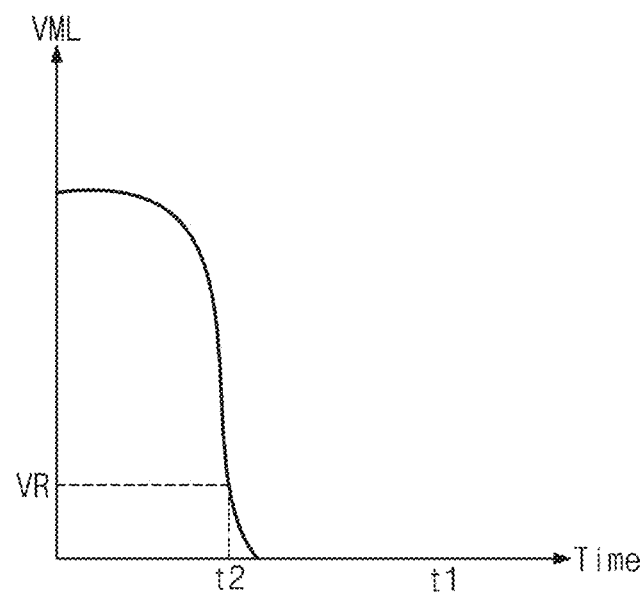

FIG. 7D is a graph for describing a voltage of the first match line ML1 over time in the third case CASE 3 of FIG. 7A. A horizontal axis of a graph of FIG. 7D indicates a time, and a vertical axis of a graph of FIG. 7D indicates the voltage VML of the first match line ML1. Referring to FIG.

7D, the voltage VML of the first match line ML1 may be discharged to the ground voltage GND. Because all the cells C11 to C14 of the first memory cell group 1200_1 are mismatched, the voltage VML of the first match line ML1 may be discharged from a precharged voltage to the ground voltage GND. For example, the voltage VML of the first match line ML1 may have the reference voltage VR at a second time point t2 earlier than the first time point t1.

Figure 8:
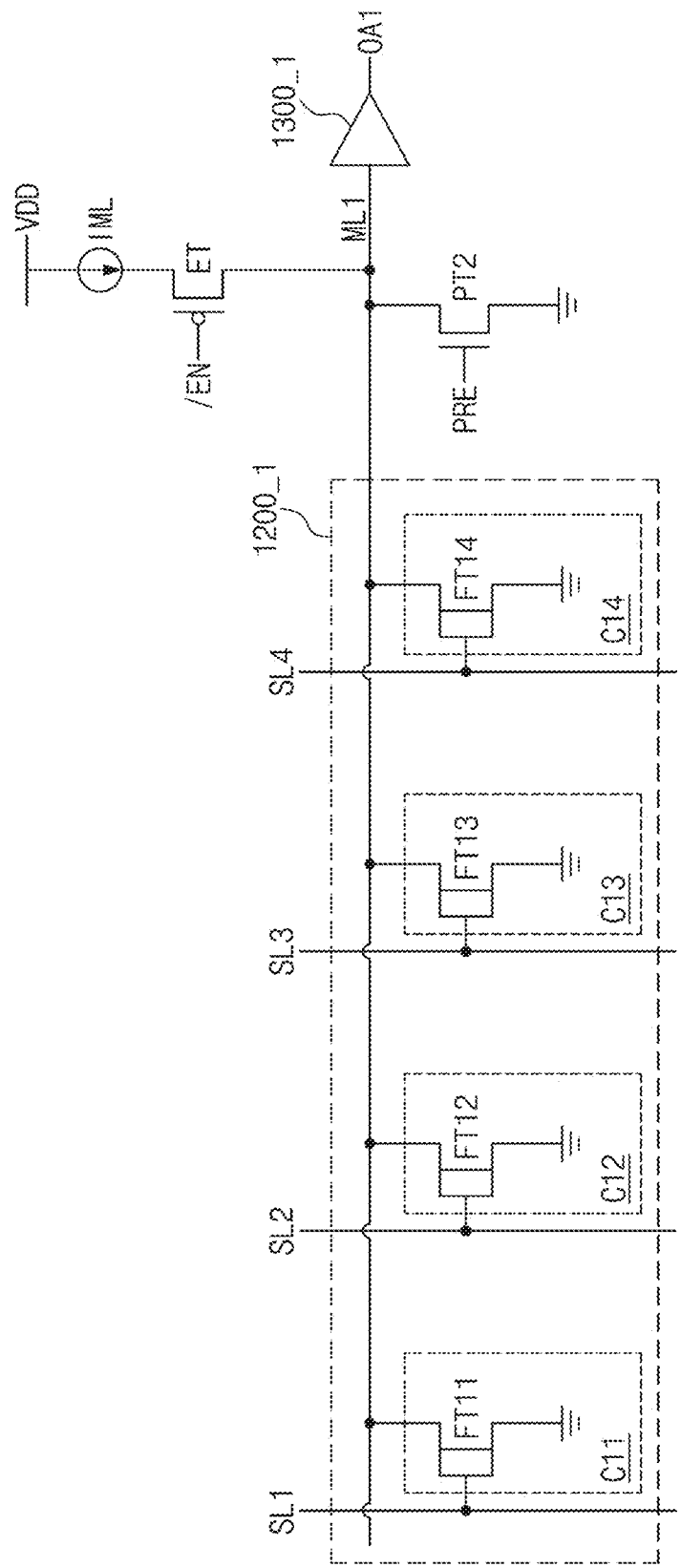
FIG. 8 is a block diagram illustrating an example of a part of the CAM device of FIG. 1.

FIG. 8 is a block diagram illustrating an example of a part of the CAM device of FIG. 1. For brevity of drawing and for convenience of description, only the first memory cell group 1200_1 is shown in FIG. 8. The other memory cell groups 1200_2 to 1200_4 may be the same as or similar to the first memory cell group 1200_1. Referring to FIG. 8, a current-race scheme is described.

Referring to FIGS. 1 and 8, each of the first to fourth memory cells C11 to C14 may include a FeTFET. For example, the first memory cell C11 may include the first FeTFET FT11; the second memory cell C12 may include the second FeTFET FT12; the third memory cell C13 may include the third FeTFET FT13; and, the fourth memory cell C14 may include the fourth FeTFET FT14. A gate of the first FeTFET FT11 may be connected to the first search line SL1; a gate of the second FeTFET FT12 may be connected to the second search line SL2; a gate of the third FeTFET FT13 may be connected to the third search line SL3; and, a gate of the fourth FeTFET FT14 may be connected to the fourth search line SL4.

The first FeTFET FT11 may be connected between the first match line ML1 and the ground voltage GND (or a specific voltage, for example, VSS); the second FeTFET FT12 may be connected between the first match line ML1 and the ground voltage GND; the third FeTFET FT13 may be connected between the first match line ML1 and the ground voltage GND; and, the fourth FeTFET FT14 may be connected between the first match line ML1 and the ground voltage GND.

The CAM device 1000 may further include a current source IML, a second precharge transistor PT2, and an activation transistor ET. The second precharge transistor PT2 is connected between the ground voltage GND and the first match line ML1, and may operate in response to a precharge signal PRE. For example, the second precharge transistor PT2 may be an NMOS transistor. The second precharge transistor PT2 may precharge the first match line ML1 to the ground voltage GND in response to the precharge signal PRE.

The current source IML may be connected between the power supply voltage VDD and the activation transistor ET. The activation transistor ET is connected between the current source IML and the first match line ML1, and may operate in response to a complementary activation signal/EN. For example, the activation transistor ET may be a PMOS transistor. The first match amplifier 1300_1 may be connected between the first match line ML1 and the amplifier output line OA1.

Unlike the illustration of FIG. 3, the first match line ML1 may be precharged to the ground voltage GND (or a specific voltage, for example, VSS). For example, the specific voltage VSS may be a voltage that is equal to or lower than the ground voltage GND. However, the present disclosure is not limited thereto. The match state of the first memory cell group 1200_1 may be evaluated by charging the first match line ML1 with a current provided by the current source IML.

To search for data, the CAM device 1000 may perform a search line/match line precharge step and a match line evaluation step. That is, unlike the illustration of FIG. 3, the search line/match line precharge step may be performed at the same time instead of performing the match line precharge step after performing the search line precharge step. In other words, the first match line ML1 is precharged to the ground voltage GND, and thus the search line precharge step and the match line precharge step may be performed at the same time.

The CAM device 1000 may precharge the search line in the search line/match line precharge step and may precharge the first match line ML1 to the ground voltage GND. Afterward, in the match line evaluation step, the CAM device 1000 may apply a voltage corresponding to the codeword to the plurality of search lines SL1 to SL4. The current source IML may be connected to the first match line ML1 in response to the complementary activation signal/EN. When a mismatch occurs in at least one cell among the plurality of memory cells C11 to C14 of the first memory cell group 1200_1, the first match line ML1 may be charged with a miss voltage $V_{Miss}$ as shown in Equation 1 according to a voltage dividing principle of series resistors. 'm' denotes the number of mismatched cells in the first memory cell group 1200_1; $R_{FT}$ denotes the resistance of the FeTFET corresponding to a mismatched cell; and, $R_{IML}$ denotes the resistance of a current source.

$$V_{Miss} = \frac{R_{FT}}{R_{FT} + m \times R_{IML}} V_{DD} \text{ (Using a steady state)} \quad \text{[Equation 1]}$$

$$V_{Miss} = \frac{I_{ML} - m \times I_{FT}}{C_{ML}} t \text{ (Using a transient state)} \quad \text{[Equation 2]}$$

In the case where all the memory cells C11 to C14 of the first memory cell group 1200_1 are matched, when the first match line ML1 is charged to be a steady-state because the capacitance of the match line is sufficiently charged, the first match line ML1 may be charged to the power supply voltage VDD. Alternatively, when a transient state is utilized, match/mismatch may be determined by using a time 't' required to charge capacitance CML of a match line by a difference between a current $I_{ML}$ of a current source and the sum of 'm' currents $I_{FT}$ of mismatched FeTFETs.

In an embodiment, the first match amplifier 1300_1 may determine whether the codeword matches or does not match data stored in the first memory cell group 1200_1, based on a voltage level of the first match line ML1. For example, when it is determined that the first match line ML1 is charged, the first match amplifier 1300_1 may determine that the data stored in the first memory cell group 1200_1 matches the codeword. When it is determined that the first match line ML1 maintain a low voltage or ground voltage, the first match amplifier 1300_1 may determine that the data stored in the first memory cell group 1200_1 does not match the codeword.

As described above, unlike the illustration of FIG. 3, before the search operation, the first match line ML1 of the first memory cell group 1200_1 may be precharged (or charged) to the ground voltage GND (or low voltage), and the first match line ML1 may be charged to a high voltage or maintained to a low voltage depending on match/mismatch between the stored data and search data.

Figure 9:
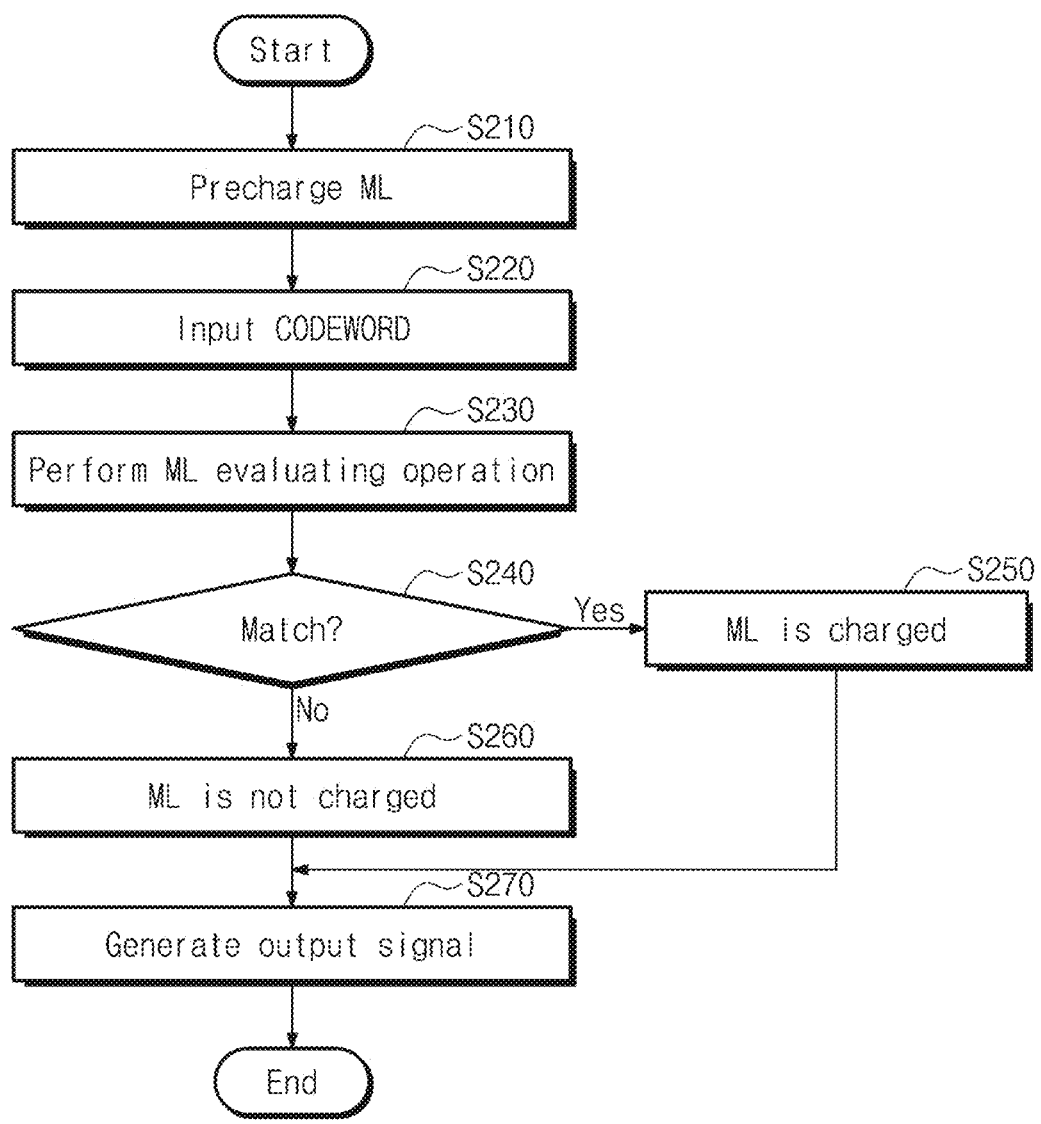
FIG. 9 is a flowchart illustrating an example of an operating method of the CAM device of FIG. 1 including the first memory cell group of FIG. 8.

FIG. 9 is a flowchart illustrating an example of an operating method of the CAM device of FIG. 1 including the first memory cell group of FIG. 8. Referring to FIGS. 1, 8, and 9, in operation S210, the CAM device 1000 may precharge a match line. Hereinafter, for convenience of description, the description is based on the first memory cell group 1200_1. The second to fourth memory cell groups 1200_2 to 1200_4 operate identically or similarly to the first memory cell group 1200_1, and thus a detailed description thereof will be omitted to avoid redundancy. For example, the CAM device 1000 may precharge the first match line ML1 by applying the ground voltage GND to the first match line ML1.

In operation S220, the CAM device 1000 may input a codeword. For example, the driver 1100 of the CAM device 1000 may provide (or input) the codeword to the first memory cell group 1200_1 through the plurality of search lines SL1 to SLA. The CAM device 1000 may apply a voltage corresponding to the codeword to the plurality of search lines SL1 to SL4.

In operation S230, the CAM device 1000 may perform a match line evaluation operation. For example, each of the first to fourth memory cells C11 to C14 may determine whether data is matched/mismatched (or match/mismatch), by comparing stored data with the codeword.

In operation S240, the CAM device 1000 may determine a match/mismatch of a match line. For example, the CAM device 1000 may determine whether the first match line ML1 is matched/mismatched. When the match line is matched, the CAM device 1000 performs operation S250. When the match line is mismatched, the CAM device 1000 performs operation S260.

In operation S250, the match line may be charged. For example, when all of the memory cells C11 to C14 of the first memory cell group 1200_1 are matched, the first match line ML1 may not be discharged. That is, the first match line ML1 may be charged to a high voltage by a current provided by the current source IML. That is, the first match line ML1 may increase from the ground voltage GND to a high voltage or the power supply voltage VDD.

In operation S260, the match line may not be charged. For example, when at least one of the memory cells C11 to C14 of the first memory cell group 1200_1 is mismatched, the first match line ML1 may maintain a low voltage or the ground voltage GND. Because a discharge current path is generated by the mismatched memory cells among the memory cells C11 to C14 of the first memory cell group 1200_1, a current supplied from the current source IML may be canceled, and thus the ground voltage GND precharged on the first match line may be maintained.

In operation S270, the CAM device 1000 may generate an output signal. For example, the CAM device 1000 may generate the output signal based on a charging rate. The first match amplifier 1300_1 may generate the output signal including the match result and the degree of mismatch (or the number of mismatched bits) through the first amplifier output line OA1 and may transmit the output signal to the priority encoder 1400.

FIGS. 10A to 10D are diagrams for describing an operation of the first memory cell of FIGS. 3 and 8. The first to fourth FeTFETs FT11 to FT14 are configured to be substantially identical to one another and operate substantially identically to one another. Accordingly, for convenience of description, the first FeTFET FT11 is described as an example, and each of the remaining FeTFETs FT12 to FT14 are the same as or similar to the first FeTFET FT11, and thus a detailed description thereof will be omitted to avoid redundancy.

Referring to FIGS. 1, 3, 8, and 10A, the first memory cell C11 may store 2 bits. For example, the first memory cell C11 may store logic '11', '01', '00', or '10'. When the CAM device 1000 is a TCAM device, the first memory cell C11 may additionally store 'XX'.

In an embodiment, in the case where the first memory cell C11 stores '11', when the voltage VSL of the first search line SL1 is not less than 0 V and is not greater than a first voltage V1, a drain current ID may be smaller than a reference current. When the voltage VSL of the first search line SL1 exceeds the first voltage V1, the drain current ID may be greater than the reference current.

In the case where the first memory cell C11 stores '01', when the voltage VSL of the first search line SL1 is not less than the first voltage V1 and is not greater than the second voltage V2, the drain current ID may be less than the reference current. When the voltage VSL of the first search line SL1 is less than the first voltage V1 or greater than the second voltage V2, the drain current ID may be greater than the reference current.

In the case where the first memory cell C11 stores '00', when the voltage VSL of the first search line SL1 is not less than the second voltage V2 and is not greater than a third voltage V3, the drain current ID may be less than the reference current. When the voltage VSL of the first search line SL1 is less than the second voltage V2 or greater than the third voltage V3, the drain current ID may be greater than the reference current.

In the case where the first memory cell C11 stores '10', when the voltage VSL of the first search line SL1 is not less than the third voltage V3 and is not greater than a fourth voltage V4, the drain current ID may be less than the reference current. When the voltage VSL of the first search line SL1 is less than the third voltage V3 or greater than the fourth voltage V4, the drain current ID may be greater than the reference current.

In the case where the first memory cell C11 stores 'XX', when the voltage VSL of the first search line SL1 is not less than 0 V and is not greater than the fourth voltage V4, a drain current ID may be smaller than a reference current. When the voltage VSL of the first search line SL1 is less than 0 V or greater than the fourth voltage V4, the drain current ID may be greater than the reference current.

Figure 10A:
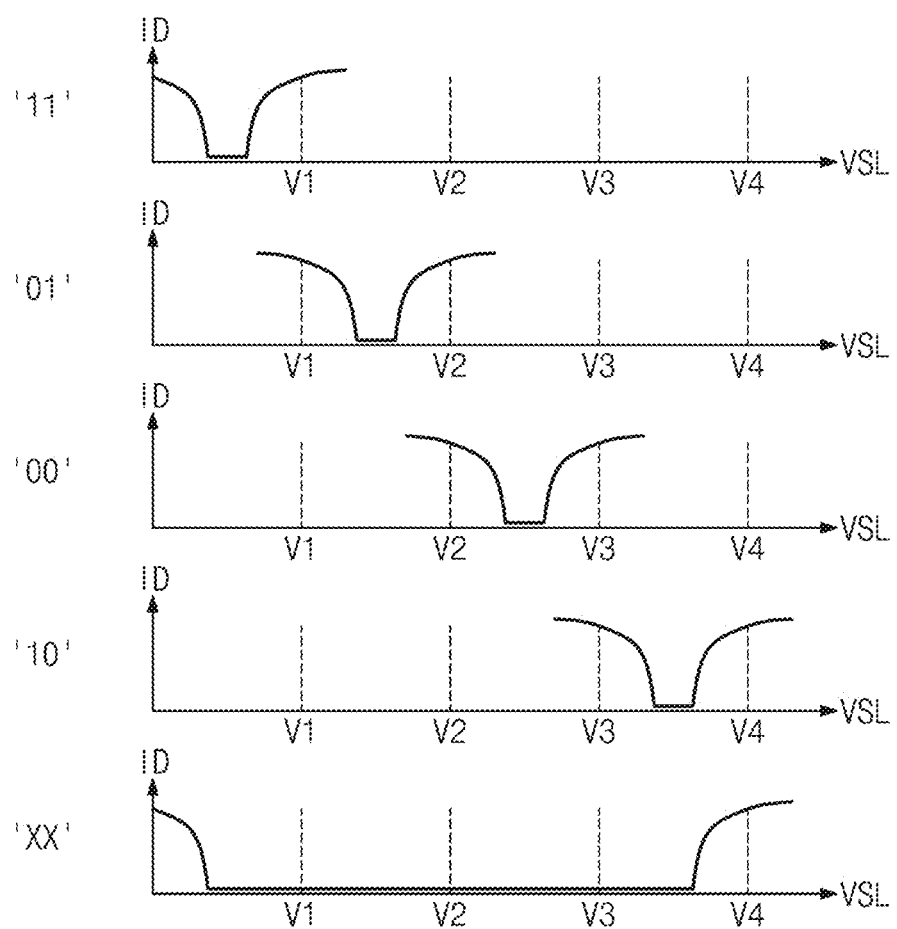
FIGS. 10A to 10D are diagrams for describing an operation of the first memory cell of FIGS. 3 and 8.
Figure 10B:
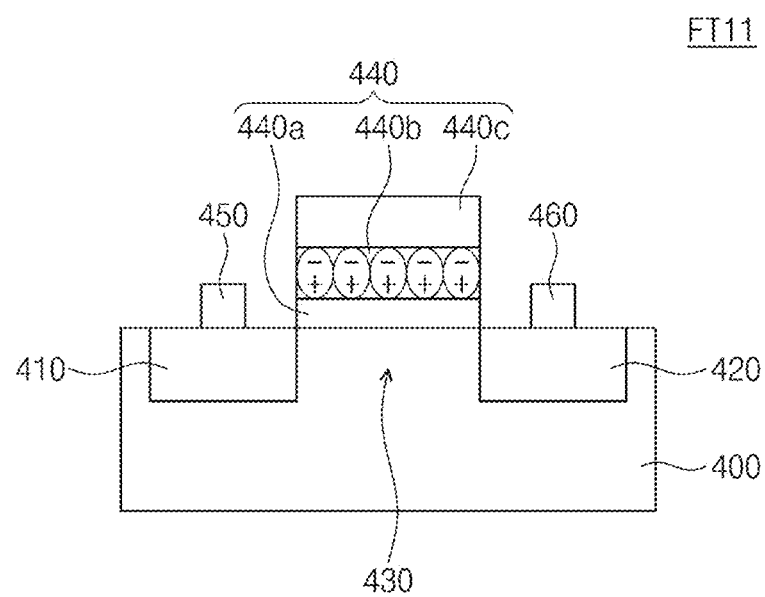

A method in which '11' or '01' is programmed (or stored) in the first memory cell C11 is described with reference to FIG. 10B. In an embodiment, the ferroelectric layer 440b may have a first polarization state by applying a positive voltage to the gate electrode layer 440c and applying the ground voltage GND (alternatively, a specific voltage VSS equal to or lower than the ground voltage GND or a low voltage) to the first electrode 450 and the second electrode 460. For example, the first polarization state may be a down polarization state. Electrons may be accumulated in an upper portion of the channel region 430. A first positive voltage is applied to the gate electrode layer 440c, and thus '11' may be programmed in the first memory cell C11. A second positive voltage less than the first positive voltage is applied to the gate electrode layer 440c, and thus '01' may be programmed in the first memory cell C11.

Figure 10C:
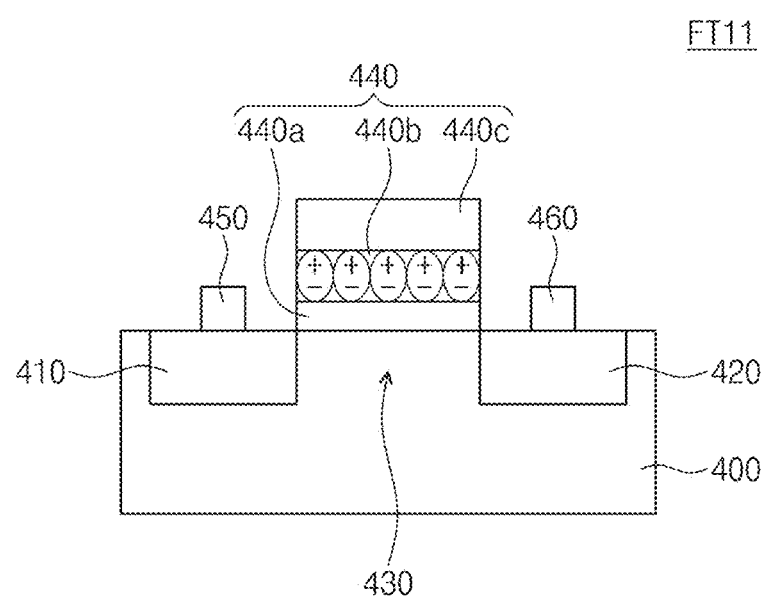

A method in which '00' or '10' is programmed in the first memory cell C11 is described with reference to FIG. 10C. In an embodiment, the ferroelectric layer 440b may have a second polarization state by applying a negative voltage to the gate electrode layer 440c and applying the ground voltage GND (or a specific voltage VSS equal to or lower than the ground voltage GND) to the first electrode 450 and the second electrode 460. For example, the second polarization state may be an up polarization state. Holes may be accumulated in the upper portion of the channel region 430. A first negative voltage is applied to the gate electrode layer 440c, and thus '00' may be programmed in the first memory cell C11. A second negative voltage is applied to the gate electrode layer 440c, and thus '10' may be programmed in the first memory cell C11. An absolute value of the second negative voltage may be greater than an absolute value of the first negative voltage.

Figure 10D:
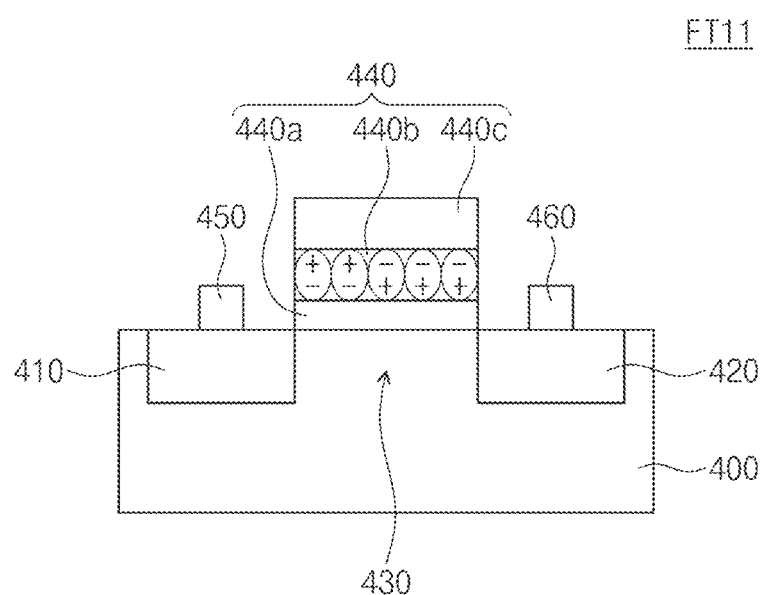

A method in which 'XX' is programmed in the first memory cell C11 is described with reference to FIG. 10D. In an embodiment, the ferroelectric layer 440b may have a third polarization state by applying a third positive voltage to the gate electrode layer 440c, applying a fourth positive voltage greater than the third positive voltage to the first electrode 450, and applying the ground voltage GND (or the specific voltage VSS equal to or lower than the ground voltage GND) to the second electrode 460. Holes may be accumulated in the upper portion of the channel region 430 adjacent to the first doped region 410. Electrons may be accumulated in the upper portion of the channel region 430 adjacent to the second doped region 420.

Figure 11:
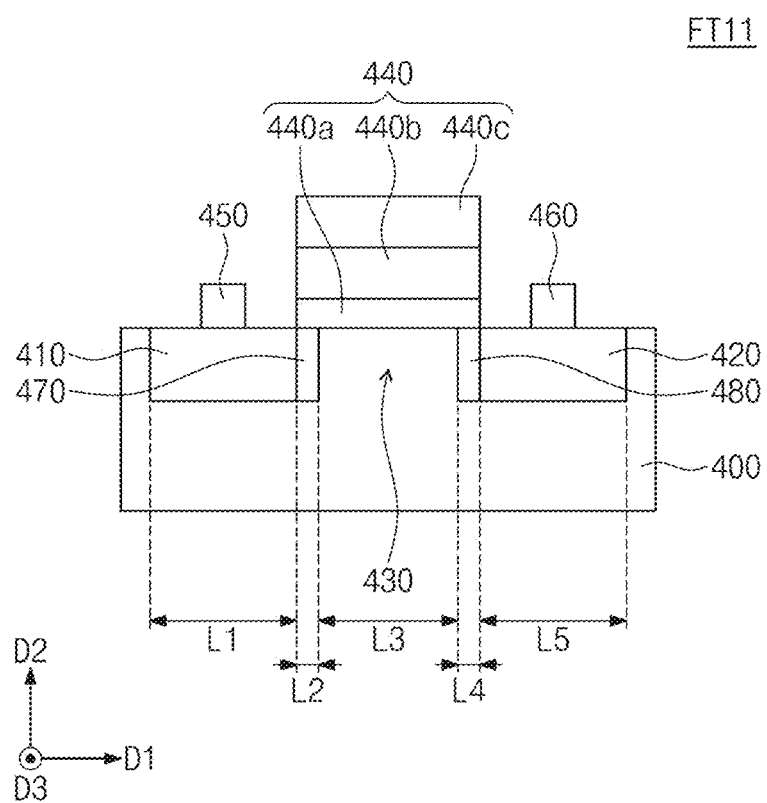
FIG. 11 is a diagram illustrating an example of the first FeTFET device of FIGS. 3 and 8.

FIG. 11 is a diagram illustrating an example of the first FeTFET device of FIGS. 3 and 8. Hereinafter, for brevity of drawing and for convenience of description, additional description associated with components the same as or similar to the above components will be omitted to avoid redundancy.

Referring to FIGS. 3, 8, and 11, the first FeTFET FT11 may include the first doped region 410, the second doped region 420, the channel region 430, a first delta doped region 470, and a second delta doped region 480, which are formed on the semiconductor substrate 400. The first FeTFET FT11 may further include the gate 440, the first electrode 450, and the second electrode 460.

In an embodiment, the first delta doped region 470 may be formed adjacent to the first doped region 410 in the first direction D1. The first delta doped region 470 may be formed between the first doped region 410 and the channel region 430. The first delta doped region 470 may be formed (alternatively, disposed or positioned) under the gate 440. The first delta doped region 470 may have a conductivity type opposite to that of the first doped region 410. For example, the first delta doped region 470 may have a second conductivity type. The first delta doped region 470 may have an N+ type thus heavily doped. The first delta doped region 470 may be a source pocket region doped with impurities having the same conductivity type as the second doped region 420 at a high concentration.

The first delta doped region 470 may have a first delta doping concentration. The doping concentration of the first delta doped region 470 may be higher than that of the channel region 430 or the semiconductor substrate 400. The doping concentration of the first delta doped region 470 may be equal to or higher than the doping concentration of the second doped region 420.

In an embodiment, the second delta doped region 480 may be formed adjacent to the second doped region 420 in the first direction D1. The second delta doped region 480 may be formed between the second doped region 420 and the channel region 430. The second delta doped region 480 may be formed under the gate 440. The second delta doped region 480 may have a conductivity type opposite to that of the second doped region 420. For example, the second delta doped region 480 may have a first conductivity type. The second delta doped region 480 may have a P+ type thus heavily doped. The second delta doped region 480 may be a drain pocket region doped with impurities having the same conductivity type as the first doped region 410 at a high concentration.

The second delta doped region 480 may have a second delta doping concentration. The doping concentration of the second delta doped region 480 may be higher than that of the channel region 430 or the semiconductor substrate 400. The doping concentration of the second delta doped region 480 may be equal to or higher than the doping concentration of the first doped region 410.

A width of the first doped region 410 in the first direction D1 may be a first length L1; a width of the first delta doped region 470 in the first direction D1 may be a second length L2; a width of the channel region 430 in the first direction D1 may be a third length L3: a width of the second delta doped region 480 in the first direction D1 may be a fourth length L4; and, a width of the second doped region 420 in the first direction D1 may be a fifth length L5.

The second length L2 may be less than the first length L1 or the third length L3. For example, a ratio of the second length L2 to the third length L3 may be 1:250. The fourth length L4 may be less than the third length L3 or the fifth length L5. For example, the ratio of the fourth length L4 to the third length L3 may be 1:250. The second length L2 and the fourth length L4 may be the same as or similar to each other. However, the present disclosure is not limited thereto.

Accordingly, the CAM device 1000 may facilitate a band-to-band tunneling of the first FeTFET FT11 device and may reduce a turn-on voltage VTH, thereby improving a turn-on operation and a bipolar (ambipolar) behavior.

Figure 12:
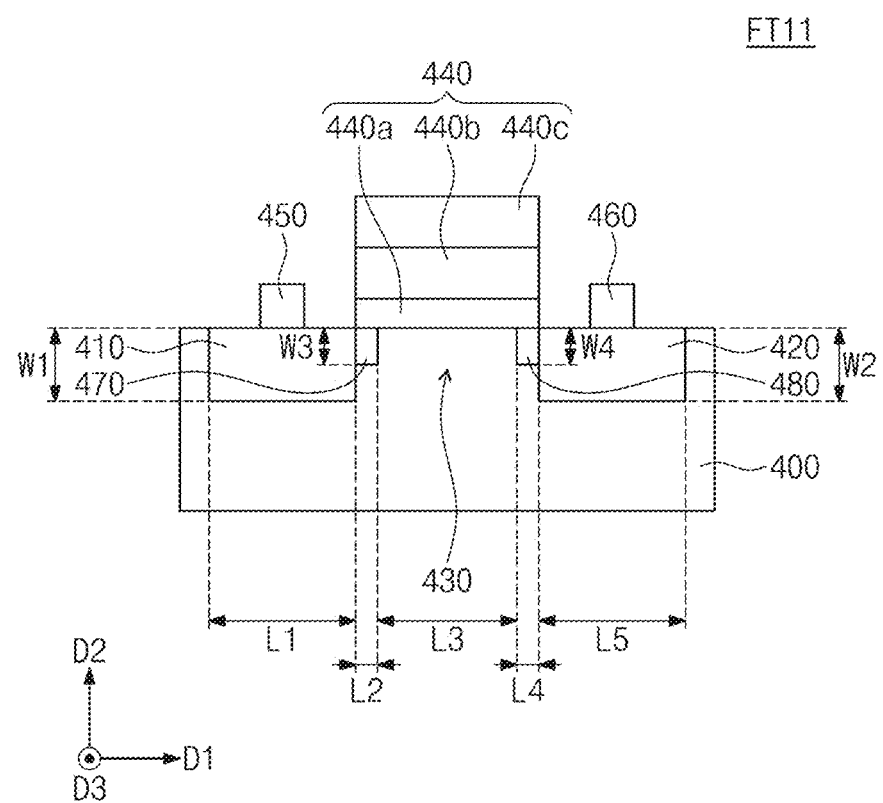
FIG. 12 is a diagram illustrating an example of the first FeTFET device of FIGS. 3 and 8.

FIG. 12 is a diagram illustrating an example of the first FeTFET device of FIGS. 3 and 8. Hereinafter, for brevity of drawing and for convenience of description, additional description associated with components the same as or similar to the above components will be omitted to avoid redundancy.

Referring to FIGS. 3, 8, 11, and 12, in an embodiment, the doping concentration of the first delta doped region 470 may be adjusted. For example, the first delta doped region 470 may have a third delta doping concentration different from the first delta doping concentration. The doping concentration of the second delta doped region 480 may be adjusted. For example, the second delta doped region 480 may have a fourth delta doping concentration different from the second delta doping concentration.

In an embodiment, unlike the illustration of FIG. 11, the first delta doped region 470 of FIG. 12 may not deeply extend toward the semiconductor substrate 400 like the first doped region 410. The second delta doped region 480 of FIG. 12 may not deeply extend toward the semiconductor substrate 400 like the second doped region 420.

A width of the first doped region 410 in the second direction D2 of FIG. 11 may be the same as a width of the first delta doped region 470 in the second direction D2. A width of the second doped region 420 in the second direction D2 of FIG. 11 may be the same as a width of the second delta doped region 480 in the second direction D2.

On the other hand, a width of the first doped region 410 in the second direction D2 of FIG. 12 may be different from a width of the first delta doped region 470 in the second direction D2. A width of the second doped region 420 in the second direction D2 of FIG. 12 may be different from a width of the second delta doped region 480 in the second direction D2. A width of the first doped region 410 in the second direction D2 may be a first width W1; a width of the second doped region 420 in the second direction D2 may be a second width W2; a width of the first delta doped region 470 in the second direction D2 may be a third width W3; and a width of the second delta doped region 480 in the second direction D2 may be a fourth width W4. The third width W3 may be smaller than the first width W1. The fourth width W4 may be smaller than the second width W2. The third width W3 and the fourth width W4 may be the same as or similar to each other.

Figure 13:
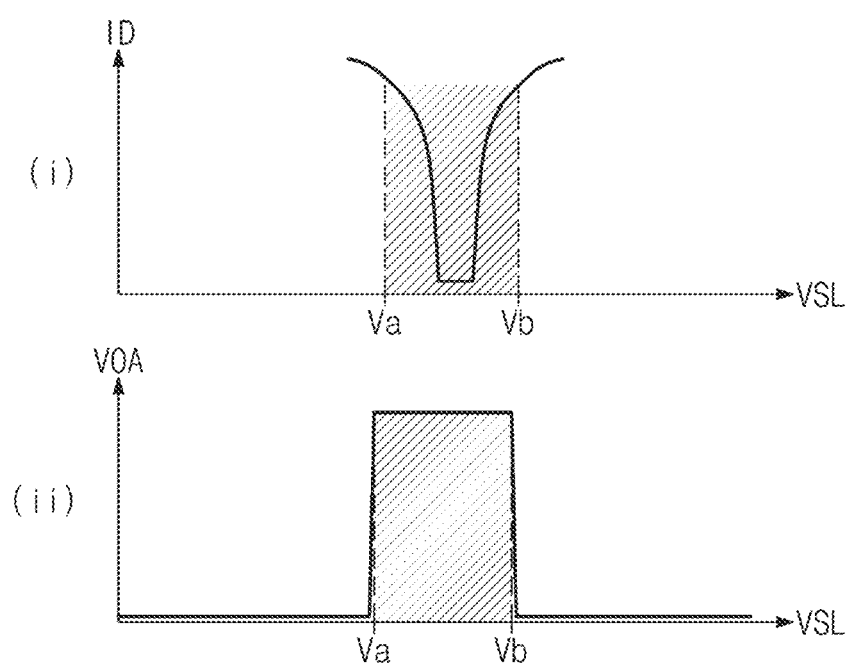
FIG. 13 is a graph for describing the first FeTFET device feature of FIGS. 3 and 8.

FIG. 13 is a graph for describing the first FeTFET device feature of FIG. 3. Referring to FIGS. 1, 3, and 13, a graph (i) of FIG. 13 shows the drain current ID relative to the gate voltage VSL (i.e., a voltage of the first search line SL1) applied through a search line. That is, a horizontal axis of graph (i) indicates the gate voltage VSL, and a vertical axis of graph (i) indicates the drain current ID. Graph (ii) illustrates the voltage VOA (i.e., a voltage of the amplifier output line OA1) of an output terminal of a match amplifier relative to the gate voltage VSL applied through the search line. That is, a horizontal axis of graph (ii) indicates the gate voltage VSL, and a vertical axis of graph (ii) indicates the voltage VOA of the output terminal of the match amplifier.

Referring to FIG. 13, it may be understood that a current in the FeTFET device is very low within a specific voltage range (a range between Va and Vb) of the gate voltage. However, the FeTFET device has a band rejection feature for a voltage, which is referred to as an "ambipolar behavior" in which a current rapidly increases when the current deviates from a specific voltage range. That is, when the current is within a specific voltage range, the FeTFET device is turned off. When the current is out of the specific voltage range, the FeTFET device is turned on automatically.

Figure 14:
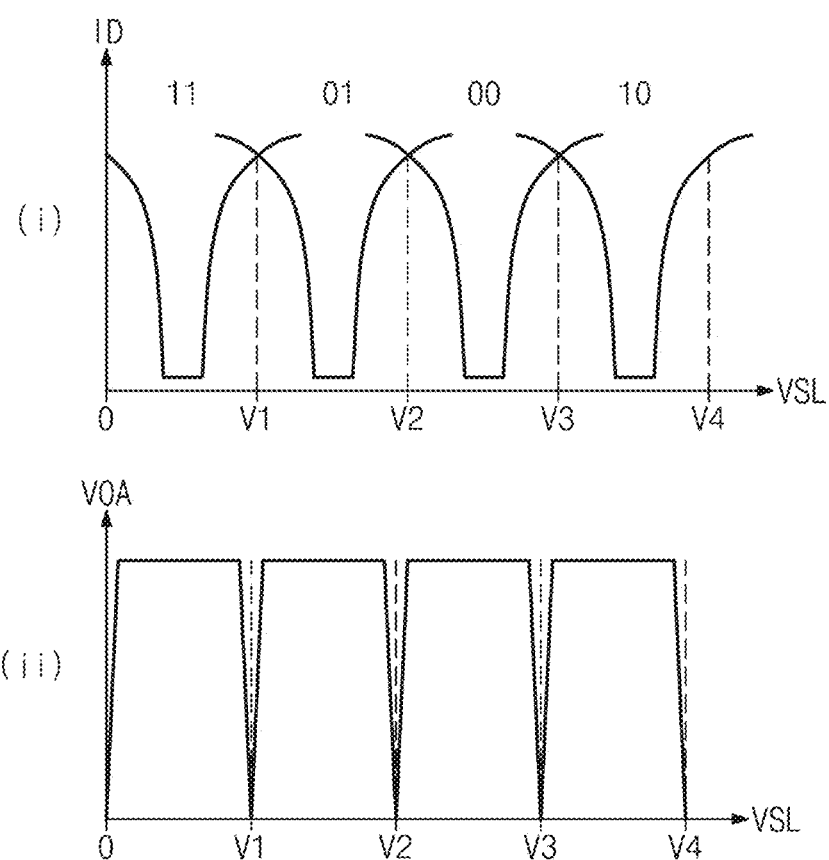
FIG. 14 is a graph for describing a 2-bit implementation operation using a switching feature of the first FeTFET device of FIGS. 3 and 8.

When the MOSFET device of FIG. 2A is replaced with an FeTFET device as shown in FIG. 3 due to the feature, multi-bit CAM may be implemented by using only one transistor without a complementary search line/SL, and up to an operation of a degree of mismatch may be implemented at the same time. Moreover, rapid on-off switching feature improves multi-bit sensing accuracy, and the degree of mismatch may be accurately determined by using features of the low off-current and low on-current FIG. 14 is a graph for describing a 2-bit implementation operation using a switching feature of the first FeTFET device of FIG. 3. A graph (i) of FIG. 14 shows the drain current ID relative to the gate voltage VSL applied through a search line, and a graph (ii) of FIG. 14 shows the voltage VOA of an output terminal of a sense amplifier relative to the gate voltage VSL applied through a search line.

Referring to FIG. 14, it may be understood that a difference between a current flowing when the search data matches the stored data and a current flowing when the search data does not match the stored data is maximized.

The FeTFET device is driven under a reverse direction voltage condition of a gate pin diode structure, and thus the FeTFET devices have an off-current much lower than a MOSFET device. Moreover, the FeTFET device has a low driving voltage due to abrupt on-off switching. In addition, the FeTFET device has a relatively low on-current because a tunneling current is used. This means that the accuracy of match/mismatch and power consumption are capable of being reduced when a large-capacity CAM is implemented. That is, it is possible to implement an accurate low-power CAM that determines the degree of mismatch by using a very low off-current and a low driving voltage and by reversely using a low on-current.

Figure 15:
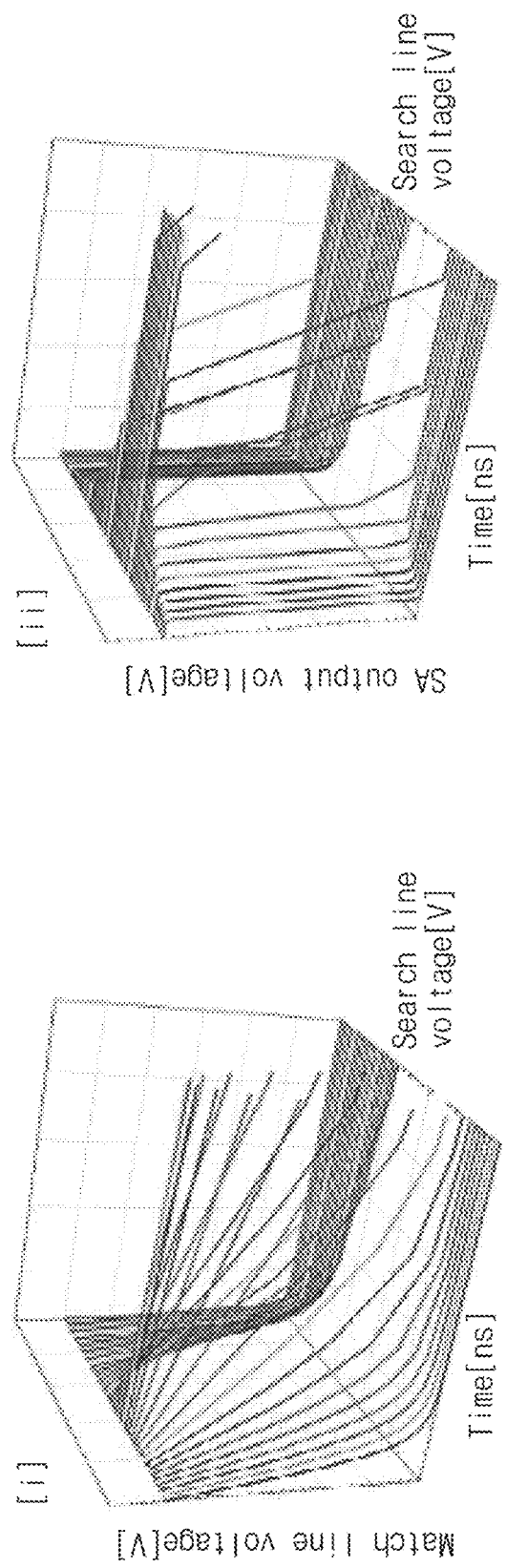
FIG. 15 is a graph obtained by predicting an operation for determining a degree of mismatch of CAM, according to an embodiment of the present disclosure.

FIG. 15 is a graph obtained by predicting an operation for determining a degree of mismatch of CAM, according to an embodiment of the present disclosure. A graph (i) of FIG. 15 shows a change in a voltage V of a match line relative to the gate voltage VSL applied through a search line, and a graph (ii) of FIG. 15 shows the voltage VSAOUT or VOA of an output terminal of a sense amplifier (or a match amplifier) relative to the gate voltage VSL applied through a search line.

FIG. 15 shows an operation prediction graph in a precharge-high method. In general, a high voltage is applied to the match line ML during a precharge operation. When search data (or a codeword) matches the stored data, the high voltage of the match line is maintained. In contrast, when the search data does not match the stored data, the match line is discharged, and a voltage drop occurs at the output terminal OA of a sense amplifier (or a match amplifier). On the other hand, in a current race method, a low voltage is applied to the match line ML during a precharge operation. When the search data does not match the stored data, the low voltage of the match line is maintained. On the other hand, when the search data matches the stored data, the match line is charged. A voltage rise occurs at the output terminal OA of the sense amplifier (or a match amplifier), and thus this has an opposite trend as shown in FIG. 15.

According to an embodiment of the present disclosure, as shown in FIG. 15, in the case of the precharge-high method, the number of mismatched bits may be determined based on the discharging rate of a match line and a time difference between voltage drops at output terminals of the sense amplifier (or a match amplifier). On the other hand, unlike the illustration of FIG. 15, in the case of the current race method, the number of mismatched bits may be determined based on the charging rate of a match line and a time difference between voltage rises at output terminals of the sense amplifier (or a match amplifier)

In the precharge-high method, it may be determined that the number of mismatched bits increases as the discharge rate of a match line increases. Moreover, the number of mismatched bits may be determined through the time difference between voltage drops at output terminals of the sense amplifier. For example, as the number of mismatched bits increases from 1-bit mismatch to 8-bit mismatch, a voltage of the match line significantly decreases. As the number of mismatched bits increases, a voltage drop at the output terminal of the sense amplifier occurs in a short time. On the other hand, in the current race method, it may be determined that the number of mismatched bits decreases as the charge rate of a match line increases. Moreover, the number of mismatched bits may be determined through the time difference between voltage rises at output terminals of the sense amplifier. For example, as the number of mismatched bits increases from 1-bit mismatch to 8-bit mismatch, a voltage of the match line slowly increases. As the number of mismatched bits increases, a voltage rise at the output terminal of the sense amplifier occurs in a long time.

In an operation of determining the degree of mismatch of data, CAM memory cells need to discharge a voltage precharged on a match line depending on the degree of mismatch while adequate conductance is provided. According to an embodiment of the present disclosure, a CAM including FeTFET device-based memory cells has a low on-current (i.e., low conductivity), and thus it is very advantageous to determine the degree of mismatch as the capacity of the CAM increases.

The operation of determining the degree of mismatch is used to determine the degree of mismatch even in the case of the mismatch, rather than simply determining a relationship between input data (alternatively, search data or a codeword) and stored data in a dichotomy of match/mismatch, and is recently required for artificial intelligence or one-shot/few-shot learning.

As described above, in a CAM according to an embodiment of the present disclosure, a multi-bit CAM may be implemented by using one transistor, and a function of determining the degree of mismatch by itself may be performed. High-speed, low-power, and parallel data processing technologies required for the implementation of intelligent semiconductors may be led by using the CAM. Furthermore, in such the CAM, high-speed, low-power, high-density parallel data processing is possible, as well as applications of image processing, pattern recognition, and Internet router, and thus new growth engines may be obtained to dramatically develop the competitiveness of big data and artificial intelligence-related ICT products. This CAM may be applied to one-shot/few-shot learning using a memory-augmented neural network (MANN), which has recently gained a lot of interest in the field of artificial intelligence.

The above description refers to embodiments for implementing the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

The disclosed technology is as follows. However, it does not mean that a specific embodiment should include all of the following effects or only the following effects, and thus the scope of the disclosed technology should not be construed as being limited thereby.

According to an embodiment of the present disclosure, a CAM may perform multi-bit CAM operation by using a single transistor and may determine a degree of mismatch at the same time, by implementing a multi-bit CAM based on a FeTFET, and an operating method thereof.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A content addressable memory (CAM) device comprising:
    a memory cell array including a plurality of memory cells, each of which has a ferroelectric tunnel field effect transistor (FeTFET);
    a driver configured to provide a codeword to the memory cell array through a plurality of search lines; and
    a match amplifier connected to the plurality of memory cells through a plurality of match lines,
    wherein each of the plurality of memory cells is connected to a first search line among the plurality of search lines,
    wherein the FeTFET includes,
        a first doped region having a first conductivity type,
        a second doped region having a second conductivity type different from the first conductivity type,
        a channel region between the first doped region and the second doped region, and
        a gate on the channel region and including a ferroelectric layer,
        a first delta doped region having the second conductivity type, the first delta doped region being between the first doped region and the channel region, and
        a second delta doped region having the first conductivity type, the second delta doped region being between the second doped region and the channel region, and
    wherein the gate is connected to the first search line, and one of the first doped region and the second doped region is connected to a first match line among the plurality of match lines.

2. The CAM device of claim 1, wherein
    the FeTFET is connected between the first match line and a ground voltage, and
    the FeTFET is configured to be turned on or off in response to a voltage corresponding to a codeword applied through the first search line.

3. The CAM device of claim 1, further comprising:
    a precharge transistor connected between a first match line among the plurality of match lines and a power supply voltage and configured to operate in response to a precharge signal,
    wherein the precharge transistor is configured to precharge the first match line to the power supply voltage in response to the precharge signal.

4. The CAM device of claim 3, wherein
    when data stored in all of memory cells connected to the first match line matches a codeword, the first match line is configured not to be discharged, and
    when the data stored in at least one of the memory cells connected to the first match line does not match the codeword, the first match line is configured to be discharged.

5. The CAM device of claim 3, wherein the match amplifier is configured to determine a number of mismatched bits based on a discharge rate of the first match line.

6. The CAM device of claim 1, further comprising:
    a precharge transistor connected between a first match line among the plurality of match lines and a ground voltage and configured to operate in response to a precharge signal;
    a current source connected between a power supply voltage and an activation transistor; and
    the activation transistor connected between the current source and the first match line and configured to operate in response to an activation signal,
    wherein, in a match line precharge step, the precharge transistor is configured to precharge the first match line to the ground voltage in response to the precharge signal, and
    wherein, in a match line evaluation step after the match line precharge step, the activation transistor is configured to charge the first match line by providing a current to the first match line in response to the activation signal.

7. The CAM device of claim 6, wherein
    when data stored in all of memory cells connected to the first match line matches a codeword, the first match line is configured to be charged, and
    when data stored in at least one of the memory cells connected to the first match line does not match the codeword, the first match line is configured not to be charged.

8. The CAM device of claim 1, wherein
    the gate includes a gate insulating layer, the ferroelectric layer, and a gate electrode layer, and the ferroelectric layer includes one of PZT (Pb(Zr,Ti)O$_3$), SBT(SrBi$_2$Ta$_2$O$_9$), SBTN(SrBi$_2$(Ta,Nb)O$_9$), BLT((Bix, La1-x)$_4$Ti$_3$O$_{12}$), BST(BaxSr(1-x)TiO$_3$), hafnium oxide (HfOO$_2$), silicon-added hafnium oxide (HfO$_2$/Si), aluminum-added hafnium oxide (HfO$_2$/Al), or zirconium-added hafnium oxide (HfO$_2$/Zr).

9. The CAM device of claim 1, further comprising:
a priority encoder configured to output an address of the memory cell array having data matched with a codeword, and
wherein the match amplifier is configured to determine a match or mismatch between the codeword and data stored in memory cells connected to the first match line, based on a voltage level of a first match line, and output a match result to the priority encoder.

10. The CAM device of claim 1, wherein
a width of the first doped region in a first direction is a first length,
a width of the first delta doped region in the first direction is a second length smaller than the first length,
a width of the second doped region in the first direction is a third length, and
a width of the second delta doped region in the first direction is a fourth length smaller than the third length.

11. The CAM device of claim 10, wherein
a width of the first doped region in a second direction perpendicular to the first direction is identical to a width of the first delta doped region in the second direction, and
a width of the second doped region in the second direction is identical to a width of the second delta doped region in the second direction.

12. The CAM device of claim 10, wherein
a width of the first doped region in a second direction perpendicular to the first direction is a first width,
a width of the first delta doped region in the second direction is a second width smaller than the first width,
a width of the second doped region in the second direction is a third width, and
a width of the second delta doped region in the second direction is a fourth width smaller than the third width.

13. An operating method of a CAM device including a memory cell array including a plurality of memory cells, each of which has an FeTFET, a driver configured to provide a codeword to the memory cell array though a plurality of search lines, and a match amplifier connected to the plurality of memory cells through a match line, the method comprising:
precharging the match line by applying a power supply voltage to the match line;
inputting a codeword into a memory cell connected to the match line;
determining whether data is matched or mismatched, by comparing the data stored in the memory cell connected to the match line with the codeword;
not discharging the match line when it is determined that the codeword matches the stored data;
discharging the match line when it is determined that the codeword does not matches the stored data; and
generating, by the match amplifier, an output signal based on a discharge rate of the match line,
wherein each of the plurality of memory cells is connected to a first search line among the plurality of search lines, and
wherein the FeTFET includes,
a first doped region having a first conductivity type,
a second doped region having a second conductivity type different from the first conductivity type, the second doped region connected to the match line,
a channel region between the first doped region and the second doped region,
a gate on the channel region and including a ferroelectric layer, the gate connected to the first search line,
a first delta doped region having the second conductivity type, the first delta doped region being between the first doped region and the channel region, and
a second delta doped region having the first conductivity type, the second delta doped region being between the second doped region and the channel region.

14. The method of claim 13, wherein the inputting of the codeword includes:
applying a voltage corresponding to the codeword to the plurality of search lines.

15. The method of claim 13, wherein the output signal includes a number of mismatched bits determined based on the discharge rate and a match result.

16. An operating method of a CAM device including a memory cell array including a plurality of memory cells, each of which has an FeTFET, a driver configured to provide a codeword to the memory cell array though a plurality of search lines, a match amplifier connected to the plurality of memory cells through a match line, and a current source configured to supply a current to the match line, the method comprising:
precharging the match line by applying a ground voltage to the match line;
inputting a codeword into a memory cell connected to the match line;
determining whether data is matched or mismatched, by comparing the data stored in the memory cell connected to the match line with the codeword;
charging the match line when it is determined that the codeword matches the stored data;
not charging the match line when it is determined that the codeword does not match the stored data; and
generating, by the match amplifier, an output signal,
wherein each of the plurality of memory cells is connected to a first search line among the plurality of search lines, and
wherein the FeTFET includes,
a first doped region having a first conductivity type,
a second doped region having a second conductivity type different from the first conductivity type, the second doped region connected to the match line,
a channel region between the first doped region and the second doped region,
a gate on the channel region and including a ferroelectric layer, the gate connected to the first search line,
a first delta doped region having the second conductivity type, the first delta doped region being between the first doped region and the channel region and
a second delta doped region having the first conductivity type, the second delta doped region being between the second doped region and the channel region.

17. The method of claim 16, wherein the inputting of the codeword includes:
applying a voltage corresponding to the codeword to the plurality of search lines.

18. The method of claim 16, wherein
the charging of the match line includes charging the match line to a high voltage by a current provided by the current source, and
the not charging of the match line includes maintaining the match line to a low voltage because a current provided from the current source is canceled by generating a discharge current path by a memory cell in which a mismatch occurs.

* * * * *